US008278192B2

(12) United States Patent
Wang et al.

(10) Patent No.: US 8,278,192 B2
(45) Date of Patent: Oct. 2, 2012

(54) TRENCH FORMATION METHOD FOR RELEASING A THIN-FILM SUBSTRATE FROM A REUSABLE SEMICONDUCTOR TEMPLATE

(75) Inventors: David Xuan-Qi Wang, Fremont, CA (US); Mehrdad Moslehi, Los Altos, CA (US)

(73) Assignee: Solexel, Milpitas, CA (US)

(*) Notice: Subject to any disclaimer, the term of this patent is extended or adjusted under 35 U.S.C. 154(b) by 283 days.

(21) Appl. No.: 12/702,187

(22) Filed: Feb. 8, 2010

(65) Prior Publication Data

US 2010/0203711 A1   Aug. 12, 2010

Related U.S. Application Data

(60) Provisional application No. 61/150,392, filed on Feb. 6, 2009.

(51) Int. Cl.
*H01L 21/46* (2006.01)
*H01L 21/76* (2006.01)
(52) U.S. Cl. .................. 438/462; 438/406; 438/692
(58) Field of Classification Search .................. None
See application file for complete search history.

(56) References Cited

U.S. PATENT DOCUMENTS

| | | |
|---|---|---|
| 4,043,894 A | 8/1977 | Gibbs |
| 4,070,206 A | 1/1978 | Kressel et al. |
| 4,082,570 A | 4/1978 | House et al. |
| 4,165,252 A | 8/1979 | Gibbs |
| 4,249,959 A | 2/1981 | Jebens |
| 4,251,679 A | 2/1981 | Zwan |
| 4,348,254 A | 9/1982 | Lindmayer |
| 4,361,950 A | 12/1982 | Amick |
| 4,409,423 A | 10/1983 | Holt |
| 4,427,839 A | 1/1984 | Hall |
| 4,461,922 A | 7/1984 | Gay et al. |
| 4,479,847 A | 10/1984 | McCaldin et al. |
| 4,626,613 A | 12/1986 | Wenham et al. |
| 4,672,023 A | 6/1987 | Leung |

(Continued)

FOREIGN PATENT DOCUMENTS

JP    06-260670 A    9/1994

(Continued)

OTHER PUBLICATIONS

Alvin D. Compaan, Photovoltaics: Clean Power for the 21st Century, Solar Energy Materials & Solar Cells, 2006, pp. 2170-2180, vol. 90, Elsevier B.V.

(Continued)

*Primary Examiner* — Zandra Smith
*Assistant Examiner* — Pamela E Perkins
(74) *Attorney, Agent, or Firm* — Hulsey, P.C.; William N. Hulsey, III; John R. C. Wood

(57) ABSTRACT

A method is provided for fabricating a thin-film semiconductor substrate by forming a porous semiconductor layer conformally on a reusable semiconductor template and then forming a thin-film semiconductor substrate conformally on the porous semiconductor layer. An inner trench having a depth less than the thickness of the thin-film semiconductor substrate is formed on the thin-film semiconductor substrate. An outer trench providing access to the porous semiconductor layer is formed on the thin-film semiconductor substrate and is positioned between the inner trench and the edge of the thin-film semiconductor substrate. The thin-film semiconductor substrate is then released from the reusable semiconductor template.

3 Claims, 15 Drawing Sheets

U.S. PATENT DOCUMENTS

| | | | |
|---|---|---|---|
| 4,922,277 | A | 5/1990 | Carlson |
| 5,024,953 | A | 6/1991 | Uematsu et al. |
| 5,073,230 | A | 12/1991 | Maracas et al. |
| 5,112,453 | A | 5/1992 | Behr et al. |
| 5,208,068 | A | 5/1993 | Davis |
| 5,248,621 | A | 9/1993 | Sano |
| 5,316,593 | A | 5/1994 | Olson et al. |
| 5,348,618 | A | 9/1994 | Canham et al. |
| 5,397,400 | A | 3/1995 | Matsuno et al. |
| 5,459,099 | A | 10/1995 | Hsu |
| 5,494,832 | A | 2/1996 | Lehmann et al. |
| 5,538,564 | A | 7/1996 | Kaschmitter |
| 5,645,684 | A | 7/1997 | Keller |
| 5,660,680 | A | 8/1997 | Keller |
| 5,681,392 | A | 10/1997 | Swain |
| 5,882,988 | A | 3/1999 | Haberern et al. |
| 5,928,438 | A | 7/1999 | Salami |
| 6,049,137 | A * | 4/2000 | Jang et al. ............... 257/797 |
| 6,091,021 | A | 7/2000 | Ruby |
| 6,096,229 | A | 8/2000 | Shahid |
| 6,114,046 | A | 9/2000 | Hanoka |
| 6,127,623 | A | 10/2000 | Nakamura et al. |
| 6,204,443 | B1 | 3/2001 | Kiso et al. |
| 6,294,725 | B1 | 9/2001 | Hirschberg et al. |
| 6,331,208 | B1 | 12/2001 | Nishida et al. |
| 6,399,143 | B1 | 6/2002 | Sun et al. |
| 6,416,647 | B1 | 7/2002 | Dordi et al. |
| 6,429,037 | B1 | 8/2002 | Wenham et al. |
| 6,441,297 | B1 | 8/2002 | Keller et al. |
| 6,448,155 | B1 * | 9/2002 | Iwasaki et al. ............. 438/464 |
| 6,461,932 | B1 | 10/2002 | Wang |
| 6,524,880 | B2 | 2/2003 | Moon et al. |
| 6,534,336 | B1 | 3/2003 | Iwane |
| 6,555,443 | B1 | 4/2003 | Artmann et al. |
| 6,566,235 | B2 * | 5/2003 | Nishida et al. ............. 438/458 |
| 6,586,338 | B2 * | 7/2003 | Smith et al. ............... 438/692 |
| 6,602,760 | B2 | 8/2003 | Poortmans et al. |
| 6,602,767 | B2 | 8/2003 | Nishida et al. |
| 6,613,148 | B1 | 9/2003 | Rasmussen |
| 6,624,009 | B1 | 9/2003 | Green et al. |
| 6,645,833 | B2 | 11/2003 | Brendel |
| 6,649,485 | B2 | 11/2003 | Solanki et al. |
| 6,653,722 | B2 | 11/2003 | Blalock |
| 6,664,169 | B1 | 12/2003 | Iwasaki et al. |
| 6,756,289 | B1 | 6/2004 | Nakagawa et al. |
| 6,881,644 | B2 | 4/2005 | Malik et al. |
| 6,946,052 | B2 | 9/2005 | Yanagita et al. |
| 6,964,732 | B2 | 11/2005 | Solanki |
| 7,022,585 | B2 | 4/2006 | Solanki et al. |
| 7,026,237 | B2 | 4/2006 | Lamb |
| 7,368,756 | B2 | 5/2008 | Bruhns et al. |
| 7,402,523 | B2 | 7/2008 | Nishimura |
| 2002/0153039 | A1 | 10/2002 | Moon et al. |
| 2002/0168592 | A1 | 11/2002 | Vezenov |
| 2002/0179140 | A1 | 12/2002 | Toyomura |
| 2003/0017712 | A1 | 1/2003 | Brendel |
| 2003/0039843 | A1 | 2/2003 | Johnson |
| 2003/0124761 | A1 | 7/2003 | Baert |
| 2004/0028875 | A1 | 2/2004 | Van Rijn |
| 2004/0173790 | A1 | 9/2004 | Yeo |
| 2004/0259335 | A1 | 12/2004 | Narayanan |
| 2004/0265587 | A1 | 12/2004 | Koyanagi |
| 2005/0160970 | A1 | 7/2005 | Niira |
| 2005/0172998 | A1 | 8/2005 | Gee et al. |
| 2005/0176164 | A1 | 8/2005 | Gee et al. |
| 2005/0177343 | A1 | 8/2005 | Nagae |
| 2005/0199279 | A1 | 9/2005 | Yoshimine et al. |
| 2005/0274410 | A1 | 12/2005 | Yuuki et al. |
| 2005/0281982 | A1 | 12/2005 | Li |
| 2006/0021565 | A1 | 2/2006 | Zahler et al. |
| 2006/0043495 | A1 | 3/2006 | Uno |
| 2006/0054212 | A1 | 3/2006 | Fraas et al. |
| 2006/0070884 | A1 | 4/2006 | Momoi et al. |
| 2006/0105492 | A1 | 5/2006 | Veres et al. |
| 2006/0196536 | A1 | 9/2006 | Fujioka |
| 2006/0231031 | A1 | 10/2006 | Dings et al. |
| 2006/0266916 | A1 | 11/2006 | Miller et al. |
| 2006/0283495 | A1 | 12/2006 | Gibson |
| 2007/0077770 | A1 | 4/2007 | Wang et al. |
| 2007/0082499 | A1 | 4/2007 | Jung et al. |
| 2008/0047601 | A1 | 2/2008 | Nag et al. |
| 2008/0157283 | A1 | 7/2008 | Moslehi |
| 2008/0210294 | A1 | 9/2008 | Moslehi |
| 2008/0230115 | A1 * | 9/2008 | Kannou et al. ............ 136/252 |
| 2008/0264477 | A1 | 10/2008 | Moslehi |
| 2008/0289684 | A1 | 11/2008 | Moslehi |
| 2008/0295887 | A1 | 12/2008 | Moslehi |
| 2009/0042320 | A1 * | 2/2009 | Wang et al. ............... 438/5 |
| 2009/0107545 | A1 | 4/2009 | Moslehi |
| 2009/0301549 | A1 | 12/2009 | Moslehi |
| 2010/0022074 | A1 | 1/2010 | Wang et al. |
| 2010/0116316 | A1 | 5/2010 | Moslehi et al. |

FOREIGN PATENT DOCUMENTS

| | | |
|---|---|---|
| JP | 2002-2299661 A | 10/2002 |
| WO | PCT/EP99/08573 | 5/2000 |

OTHER PUBLICATIONS

C.Berge, 150-mm Layer Transfer for Monocrystalline Silicon Solar Cells, Solar Energy Materials & Solar Cells, 2006, pp. 3102-3107, vol. 90, Elsevier B.V.

C.Oules et al, Silicon on Insulator Structures Obtained by Epitaxial Growth of Silicon over Porous Silicon, Journal of The Electrochemical Society, Inc., 1992, p. 3595, vol. 139, No. 12, Meylan Cedex, France.

C.S.Solanki, et al, Porous Silicon Layer Transfer Processes for Solar Cells, Solar Energy Materials & Solar Cells, 2004, pp. 101-113, vol. 83, Elsevier B.V., Leuven, Belgium.

C.S.Solanki, et al, Self-Standing Porous Silicon Films by One-Step Anodizing, Journal of Electrochemical Society, 2004, pp. C307-C314, vol. 151, The Electrochemical Society, Inc., Leuven, Belgium.

F.Duerinckx, et al, Reorganized Porous Silicon Bragg Reflectors for Thin-Film Silicon Solar Cells, IEEE Electron Device Letters, Oct. 2006, vol. 27, No. 10.

Francois J. Henley, Layer-Transfer Quality Cleave Principles, SiGen, 2005, Jul. 8, pp. 1-6, The Silicon Genesis Corporation, San Jose, California.

H.J.Kim, et al, Large-Area Thin-Film Free-Standing Monocrystalline Si Solar cells by Layer Transfer, Leuven, Belgium, IEEE, 2006.

J.H.Werner et al, From Polycrystalline to Single Crystalline Silicon on Glass, Thin Solid Films, 2001, pp. 95-100, vol. 383, Issue 1-2, Elsevier Science B.V., Germany.

J.J. Schermer et al., Epitaxial Lift-Off for large area thin film III/V devices, phys. Stat. sol. (a) 202, No. 4, 501-508 (2005).

Jianhua Zhao, et al, A 19.8% Efficient Honeycomb Multicrystalline Silicon Solar Cell with Improved Light Trapping, IEEE Transactions on Electron Devices, 1999, vol. 46, No. 10.

K. Van Nieuwenhuysen et al., Progress in epitaxial deposition on low-cost substrates for thin-film crystalline silicon solar cells at IMEC, Journal of Crystal Growth, 2006, pp. 438-441, vol. 287, Elsevier B.V., Leuven, Belgium.

K.L. Chopra et al., Thin-Film Solar Cells: An Overview, Progress in Photovoltaics: Research and Applications, 2004, pp. 69-92, vol. 12, John Wiley & Sons, Ltd.

Lammert et al., The Interdigitated Back Contact Solar Cell: A Silicon Solar Cell for Use in Concentrated Sunlight, IEEE Transactions on Electron Devices, pp. 337-342, Apr. 1977.

MacDonald et al., "Design and Fabrication of Highly Topographic Nano-Imprint Template for Dual Damascene Full 3-D Imprinting," Dept. of Chemical Eng., University of Texas at Austin, Oct. 24, 2005.

Martin A. Green, Consolidation of Thin-Film Photovoltaic Technology: The Coming Decade of Opportunity, Progress in Photovoltaics: Research and Applications, 2006, pp. 383-392, vol. 14, John Wiley & Sons, Ltd.

Martin A. Green, Silicon Photovoltaic Modules: A Brief History of the First 50 Years, Progress in Photovoltaics: Research and Applications, 2005, pp. 447-455, vol. 13, John Wiley & Sons, Ltd.

Nobuhiko Sato et al, Epitaxial Growth on Porous Si for a New Bond and Etchback Silicon-on-Insulator, Journal of Electrochemical Society, Sep. 1995, vol. 142, No. 9, The Electrochemical Society, Inc., Hiratsuka, Japan.

P.J. Verlinden, et al, Sliver® Solar Cells: A New Thin-Crystalline Silicon Photovoltaic Technology, Solar Energy Materials & Solar Cells, 2006, pp. 3422-3430, vol. 90, Elsevier B.V.

P.R. Hageman et al., Large Area, Thin Film Epitaxial Lift Off III/V Solar Cells, 25th PVSC, May 13-17, 1996, Washington D.C., IEEE.

Photovoltaic Technology Research Advisory Council, A Vision for Photovoltaic Technology, 2005, pp. 1-41, European Commision Publications Office.

Prometheus Institute, U.S. Solar Industry Year in Review: U.S. Solar Energy Industry Charging Ahead, (SEIA) The Solar Energy Industry Association, 2006.

R. Brendel, et al, Sol-Gel Coatings for Light Trapping in Crystalline Thin Film Silicon Solar Cells, Journal of Non-Crystalline Solids, 1997, pp. 391-394, vol. 218, Elsevier Science B.V., Germany.

Richard Auer et al, Simplified Transfer Process for High-Current Thin-Film Crystalline Si Solar Modules, 3rd World Conference on Photovoltaic Energy Conversion, May 11-18, 2003, Osaka, Japan.

Richard M. Swanson, A Vision for Crystalline Silicon Photovoltaics, Progress in Photovoltaics: Research and Applications, 2006, pp. 443-453, vol. 14, John Wiley & Sons, Ltd.

Rolf Brendel, A Novel Process for Ultrathin Monocrystalline Silicon Solar Cells on Glass, 14th European Photovolaic Solar Energy Conference, Jun. 30-Jul. 4, 1997, Barcelona, Spain.

Rolf Brendel, Review of Layer Transfer Processes for Cystalline Thin-Film Silicon Solar Cells, The Japan Journal of Applied Physics, 2001, pp. 4431-4439, vol. 40, Part 1, No. 7, The Japan Society of Applied Physics, Japan.

Rolf Brendel, Thin-Film Crystalline Silicone Mini-Modules Using Porous Si for Layer Transfer, Solar Energy, 2004, pp. 969-982, vol. 77, Elsevier Ltd., Germany.

S. Hegedus, Thin Film Solar Modules: The Low Cost, High Throughput and Versatile Alternative to Si Wafers, Progress in Photovoltaics: Research and Applications, 2006, pp. 393-411, vol. 14, John Wiley & Sons, Ltd.

Takao Yonehara, et al, Epitaxial Layer Transfer by Bond and Etch Back of Porous Si, Applied Physics Letter 64, Apr. 18, 1994, vol. 16, American Institute of Physics.

Toshiki Yagi, et al, Ray-Trace Simulation of Light Trapping in Silicon Solar Cell with Texture Structures, Solar Energy Materials & Solar Cells, 2006, pp. 2647-2656, vol. 90, Elsevier B.V.

* cited by examiner

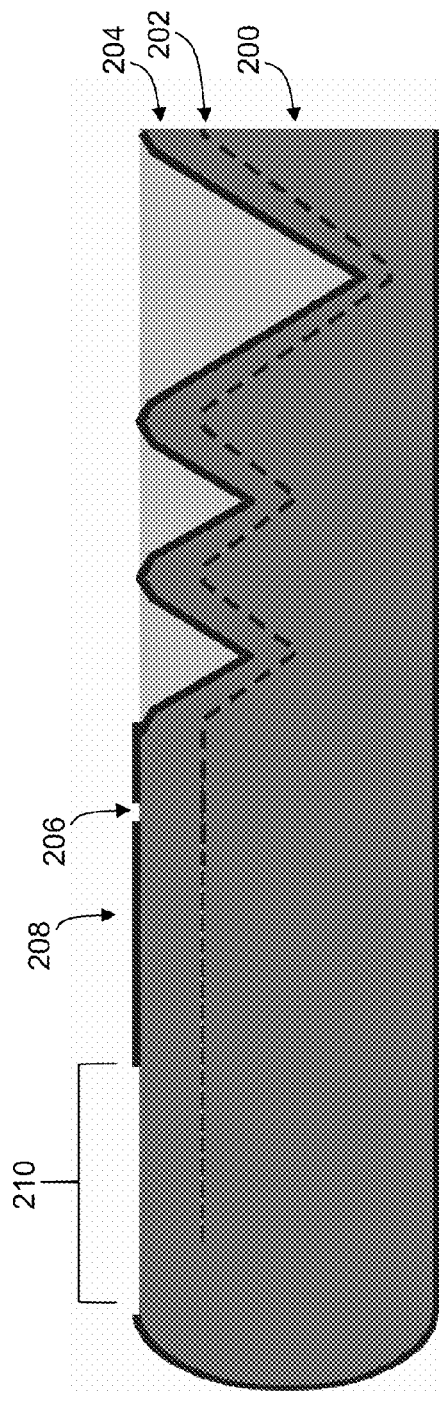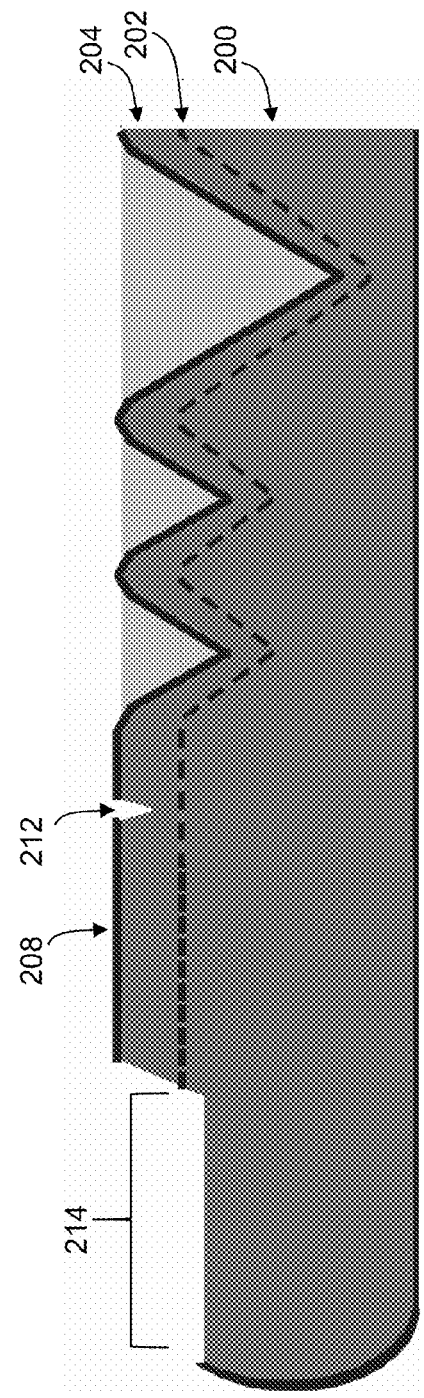
*FIGURE 11A*
*FIGURE 11B*

TRENCH FORMATION METHOD FOR RELEASING A THIN-FILM SUBSTRATE FROM A REUSABLE SEMICONDUCTOR TEMPLATE

This application claims the benefit of provisional patent application 61/150,392 filed on Feb. 6, 2009, which is hereby incorporated by reference.

This application incorporates by reference the co-pending patent application entitled "METHODS FOR MANUFACTURING THREE-DIMENSIONAL THIN-FILM SOLAR CELLS", U.S. application Ser. No. 11/868,489 (U.S. Patent Pub. No. 2008/0264477A1) by Mehrdad Moslehi and filed on Oct. 6, 2007, and is incorporated herein by reference as if fully set forth herein.

This application incorporates by reference the co-pending patent application entitled "SUBSTRATE RELEASE METHODS AND APPARATUS", U.S. application Ser. No. 12/473,811 (U.S. Patent Pub. No. 2010/0022074A1) by David Wang filed and on Apr. 28, 2009, and is incorporated herein by reference as if fully set forth herein.

FIELD

This disclosure relates in general to the fields of semiconductor microelectronics, micro-electro-mechanical systems (MESM, photovoltaics and solar cells, and more particularly to methods for making semiconductor substrates for use in three-dimensional thin-film solar cells. More specifically, to methods for forming trenches for use in releasing substantially planar and 3-D thin film semiconductor substrate from a re-usable semiconductor template.

BACKGROUND OF THE INVENTION

Current methods for manufacturing a three-dimensional thin-film solar cell (3-D TFSC) include forming a 3-Dimensional thin-film silicon substrate (3-D TFSS) using a silicon template.

FIGS. 1A and 1B illustrate a self-supporting three-dimensional honey-comb prism thin-film silicon substrate (3-D TFSS) according to U.S. application Ser. No. 11/868,489. From this 3-D TFSS, innovative silicon solar cells that have low-cost, high efficiency and light weight may be manufactured. FIG. 1A is a top view of a 3-D TFSS prior to its release from a silicon template and FIG. 1B is a cross-sectional view of a 3-D TFSS prior to its release from a silicon template.

Methods for manufacturing a 3-D TFSS such as the 3-D TFSS in FIGS. 1A and 1B, which is made of in-situ-doped epitaxial Si thin film, are disclosed in U.S. application Ser. No. 11/868,489 entitled "METHODS FOR MANUFACTURING THREE-DIMENSIONAL THIN-FILM SOLAR CELLS." First, trenches are etched into template 14 in a honeycomb pattern by deep reactive ion etching (DRIE) of silicon. Template 14 is often in the range of 500-750 micron meters thick. Next, porous silicon layer 12 is formed on the template top surface, preferably by anodic etching in HF solution. Porous silicon layer 12 is often in the range of 0.5-5 micron meters thick. Then epitaxial (or multi-crystalline) silicon layer 16 is grown on top of porous silicon layer 12 and fills the trenches. Silicon layer 16 is often in the range of 5-50 micron meters thick. After opening border definition trench 10, buried thin porous silicon layer 12 is exposed at trench bottom and serves as a sacrificial layer to be etched away and/or mechanically fractured. As a result, epitaxial silicon layer 16 is released from the template for subsequent device processing. The 3-D TFSS, made of released epitaxial silicon layer 16, will go through other process steps (including doping and metallization) for making solar cells. Silicon template 14 will be then cleaned and re-used to produce multiple released substrates.

The template re-use process includes a new layer of porous silicon formation, epitaxial silicon growth, border definition trench formation and the subsequent release of the 3-D TFSS. The template then may be re-used in multiple cycles for the purpose of reducing the silicon material consumption in making the solar cells that have 3-dimensional micro structures.

FIGS. 2A and 2B illustrate schematic drawings of another 3-D TFSS design. FIG. 2A is a top view of an inverted pyramidal 3-D TFSS prior to its release from a silicon template and FIG. 2B is a cross-sectional view of an inverted pyramidal 3-D TFSS to its release from a silicon template. Instead of using a honey-comb trench structural design as in FIGS. 1A and 1B, here the silicon template uses a staggered array of inverted pyramid cavity structures for the template design. A masking layer defines the pattern of pyramidal structures on the template. The inverted pyramid cavities are then etched by anisotropical wet silicon etching, such as KOH or TMAH, into template 22. As result of this etching, only crystallographic silicon planes are formed on the template surfaces. (111) planes form the sidewalls of the inverted pyramid cavities and (100) planes form the top of the template surface. Further, the pattern may involve staggered large and small cavities to improve the rigidity of the manufactured substrate, shown in FIG. 2B as small pyramidal cavity 28 and large pyramidal cavity 30.

Template 22 is often in the range of 500-750 micron meters thick. Next, porous silicon layer 24 is formed on the template top surface, preferably by anodic etching in HF solution. Porous silicon layer 24 is often in the range of 0.5-5 micron meters thick. Then epitaxial (or multi-crystalline) silicon layer 26 is grown on top of porous silicon layer 12 and fills the trenches. Silicon layer 26 is often in the range of 5-50 micron meters thick. After opening border definition trench 20, buried thin porous silicon layer 24 is exposed at trench bottom and serves as a sacrificial layer to be etched away and/or mechanically fractured. As a result, epitaxial silicon layer 26 is released from the template for subsequent device processing. The released 3-D TFSS, epitaxial silicon layer 26, will go through other process steps (including doping and metallization) for making solar cells. Silicon template 22 will then be cleaned and re-used to produce multiple released substrates.

In addition to the above methods for manufacturing a 3-D TFSS, "SUBSTRATE RELEASE METHODS AND APPARATUS", U.S. application Ser. No. 12/473,811 discloses methods for releasing a 3-D TFSS substrate from a re-usable silicon template. As disclosed in the incorporated application, the physical and/or chemical separation of the 3-D TFSS is initiated and propagated within the porous silicon layer that resides between the 3-D TFSS and the template.

According to the above reference application, the porous silicon layer is produced from the template silicon surface layer for every template re-use cycle using an anodic etch process. In order to use the template multiple times, the total thickness of the porous silicon layer is in the range of 0.1 μm to 10 μm, preferably in the lower range of less than 2 μm. There are two purposes of the porous silicon layer. The first purpose is to serve as a sacrificial layer to facilitate the releasing of the silicon substrate from the template. To ease the release of the silicon substrate, it is desirable that the porous silicon layer have a high porosity. The second purpose of the porous silicon layer is to serve as a seed mono-crystalline silicon layer to facilitate the epitaxial silicon growth (the silicon substrate itself). To initiate high quality epitaxial silicon growth it is desirable that the porous silicon layer have a low porosity. A bi-layer or double-layer porous silicon structure is often used so that the two porosities may be optimized relatively independently. More specifically, the first porous silicon layer furthest from the template is made in a low porosity range, preferably in the range of 10% to 30%, while the second porous silicon layer closest to the template is made subsequently in a high porosity range, preferably in the range of 60% to 85%. It is to be noted that the there may be an edge exclusion surface area on the wafer that does not get converted into porous silicon. Normally, this area may extend from the wafer edge to about 5 mm inwards. This porous silicon edge exclusion is caused by the space used for O-ring sealing during porous silicon formation process.

Also according to the above referenced application, the 3-D TFSS layer is made of epitaxial grown mono-crystalline silicon, typically in the thickness range of 5 μm to 50 μm range. Alternatively, the 3-D TFSS may be made of a deposited multi-crystalline or amorphous silicon layer, in which case the buried sacrificial layer is not limited to porous silicon. Thin film materials, such as an oxide layer of 0.1 μm to 1 μm may also be used as the sacrificial layer between the 3-D TFSS to be released and the re-usable silicon template. It is also to be noted the epitaxial silicon growth usually covers the entire silicon template top surfaces including the wafers edges. And unless some special wafers edge covering/masking method is applied, the entire porous silicon surface is buried in the epitaxial silicon layer.

As shown in FIGS. 1A and 1B and FIGS. 2A and 2B, in order to release the 3-D TFSS from the re-usable template, an enclosed border definition trench (shown as border definition trench 10 in FIGS. 1A and 1B and border definition trench 20 in FIGS. 2A and 2B) has to be made into the 3-D TFSS layer and must serve the following purposes:
 (1) Define the boundary of the 3-D TFSS, so that the shape and size of the solar cell may be defined;
 (2) Separate the 3-D TFSS to be released from the its material deposited on the wafer periphery;
 (3) Expose the buried sacrificial porous layer at trench bottom, so that the releasing of the 3-D TFSS could be initiated or ended at the trench boundary for the mechanical release methods. In the chemical-etching-assisted releasing cases, the exposed trench bottom provides an etching front for chemical etchant to reach the buried sacrificial layer.

Additionally, following are specific technical requirements for trench formation:
 (1) The process of making the trench should not affect the surface and bulk material properties of the 3-D TFSS layer;
 (2) The trench depth should be stopped and kept within the thin sacrificial layer. Trench depth shallower than the 3-D TFSS thickness will prevent chemical etchant from reaching the porous sacrificial layer, while a deeper trench depth will cut into the silicon template and make the trench forming process difficult to control in the next template re-use cycle;
 (3) The trench lateral profile may be square or a quasi-square with rounded corners to maximize a square area that is taken from a round wafer surface;
 (4) It is desirable to avoid having the trench extended or started from the wafers edge in order to prevent wafer cracking that most likely is initiated from wafer edge defects. As an example, saw blade cutting is to be avoided since it has to be started from the wafer edge and a drop-in saw may not be practical.

Given the above needs and requirements of making the border definition trenches, laser cutting, deep reactive ion etching (DRIE), wet chemical (such as KOH) silicon etching and mechanical scribing have been tested. However none of these methods are able to control the trench depth within the thin sacrificial layer.

FIG. 3 is a SEM photo of a shallow trench made by laser cutting using a Nd:YAG solid state laser with wave length of 532 nm. Using this laser cutter, the main technical challenge was the inefficient removal of silicon debris during laser cutting which caused local overheating variations. As a result, the trench surfaces are rough and depth of the trench is difficult to control. As an example, it is difficult to have a depth tolerance of less than +/−3 um for a 50 um deep trench cut. And in this case, the trench depth variation is larger the total thickness of the sacrificial porous silicon layer of the present disclosure. Therefore, to cut the trench by laser to a depth within the thin porous silicon layer is not practical.

FIG. 4 is a cross-sectional photo showing a shallow 50 um wide trench made by DRIE etching using a photo lithographically defined photo-resist mask 40. The trench is made in 50 um thick epitaxial Si layer 46 to expose 3 um thick porous Si layer 48.

The DRIE silicon etching is based on the well-known Bosch process, which uses alternating steps of etching with $SF_6$ gas and surface passivation with $C_4F_8$ gas in plasma. The etching and passivation cycles result in a straight trench sidewall with a small amount of waving surface, commonly called scalloping. When the DRIE process is used in forming trenches to release the 3-D TFSS of the disclosed subject matter, there are three phenomenons to be noted. First, because there is no etching stop layer under the epitaxial silicon layer, an over etching is required and the trench bottom ends in bulk silicon template 44. Second, when the DRIE etching process reaches the buried porous silicon layer, local charging usually occurs and results in lateral etching to form notches, shown as lateral notches 42. Third, the local charging will also cause surface roughness and form grass-like silicon microstructures at trench bottom, as visible in FIG. 4.

The challenge of using laser cutting/scribing for making border definition trenches that do not cut through the wafer is the control of trench depth. To make a narrow trench and stop the trench bottom within the buried thin porous silicon layer, no more no less, is not practical given the state of art laser machining technologies.

The issues of depth control, lateral notching and grass forming may not affect the formation of a border definition trench and the subsequent 3-D TFSS release in a first template use cycle. However, these issues may affect process controls in subsequent template re-use cycle.

The TFSS film (epitaxial silicon) thickness variation is another factor that makes trench depth control difficult. In a typical epitaxial silicon growth on a 200 mm silicon wafer, the epitaxial silicon layer thickness uniformity is 5% within wafer, 6% within run and 2% from run to run. As an example, for a 50 um thick layer, a 5% uniformity translates into +/−2.5 um thickness variation, which is equivalent to if not more than the disclosed porous silicon layer thickness.

In addition to the above factors, the wafer non-flatness, or bowing, may also cause difficulties for trench depth control. As an example, when laser cutting is used, the non-flatness will cause difficulty of the laser beam focusing control, which results in poor trench depth and surface control.

SUMMARY

Therefore a need has arisen for trench formation methods which provides for an efficient and practical manufacturing method for releasing a 3-D thin-film semiconductor substrate from a 3-D template. The trench formation method must solve the depth control problems of known trench formation methods while also defining the boundary of the 3-D TFSS to be released and providing access to the buried porous sacrificial semiconductor layer.

A further need exists for a practical method of making border definition trenches that may be implemented using the existing process technologies including laser cutting, silicon DRIE, wet silicon etching and anodic silicon etching while enabling a relatively large number of 3-D template reuses.

In accordance with the disclosed subject matter, a method for forming a border definition trench to allow and aide the release of a 3-D TFSS from a re-usable template is provided that substantially eliminates or reduces disadvantages and problems associated with previously developed trench formation methods.

The present disclosure provides a method for fabricating a 3-D thin film semiconductor substrate from a 3-D template. A porous semiconductor layer is conformally formed on a 3-D template and a thin-film semiconductor substrate is subsequently conformally formed on the porous semiconductor layer. Then an inner trench is formed on the thin-film semiconductor substrate having a depth less than the thickness of said semiconductor substrate and aligned along the crystallographic directions of the thin-film semiconductor substrate. The inner trench defines the boundary for the 3-D thin film semiconductor substrate. An outer trench is formed on the thin-film semiconductor substrate which provides access to the porous semiconductor layer. The outer trench is positioned between the inner trench and the edge of the thin-film semiconductor layer. The thin-film semiconductor substrate is then released from the 3-D template.

Additionally, fabrication methods for forming the inner and outer trenches are provided. Trench formation methods include laser cutting, mechanical scribing, silicon DRIE etching, anisotropic silicon wet etching, and anodic silicon etching.

A technical advantage of the disclosed double-trench design is that the combination of shallow inner and deep outer trenches eliminates the difficulties of trench depth tolerance control. Thus, it is not required to precisely target the trench depth so that the trench bottom is in the thin porous silicon layer. As an example, in the case of 50 um thick epitaxial silicon grown on top of a 2 um thick porous silicon flat wafer surface area, the inner shallow trench may be cut into a depth of 25 um with a tolerance of +/−15 um, while the outer deep trench may be cut into a depth of 75 um with a tolerance of +/−20 um. With these laser cutting depth and tolerance requirements, many commercially available laser cutting/scribing systems may be used. Examples of commercially available lasers include but are not limited to NY:YAG lasers, Ar laser, Excimer lasers. Further, the beam of the lasers may be in pulsing modes or continuous mode. And the interaction between the laser beam and the silicon material may be in atmospheric ambient, in vacuum, in water jet, in silicon etching gas or solutions.

The disclosed methods and designs may also be applied to making flat or substantially planar substrates from reusable flat template, in which case, the need to form 3-D structures on the template is eliminated. Therefore, the method of making substantially planar substrates from substantially planar reusable templates is yet another technical advantage of the disclosed subject matter.

The disclosed subject matter, as well as additional novel features, will be apparent from the description provided herein. The intent of this summary is not to be a comprehensive description of the claimed subject matter, but rather to provide a short overview of some of the subject matter's functionality. Other systems, methods, features and advantages here provided will become apparent to one with skill in the art upon examination of the following FIGURES and detailed description. It is intended that all such additional systems, methods, features and advantages included within this description, be within the scope of the accompanying claims.

BRIEF DESCRIPTIONS OF THE DRAWINGS

For a more complete understanding of the disclosed subject matter and advantages thereof, reference is now made to the following description taken in conjunction with the accompanying drawings in which like reference numbers indicate like features and wherein.

Figure 12A:
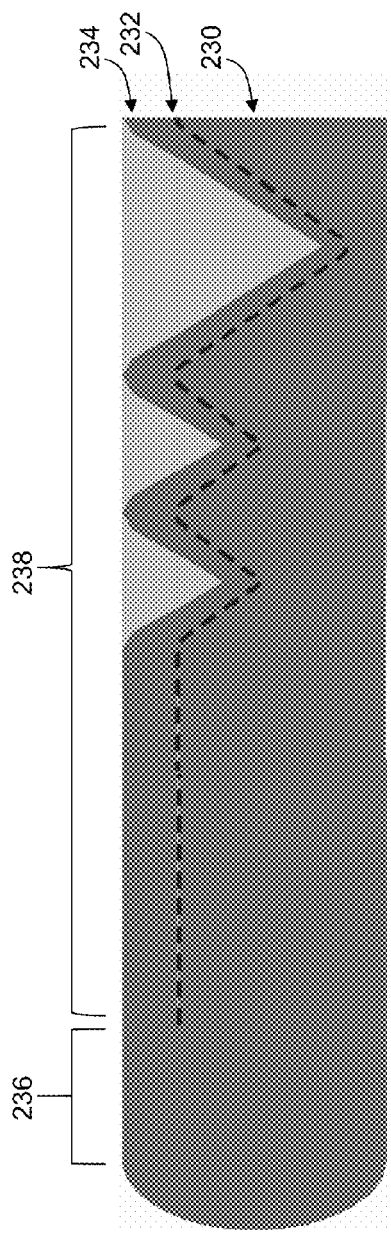
Figure 12B:
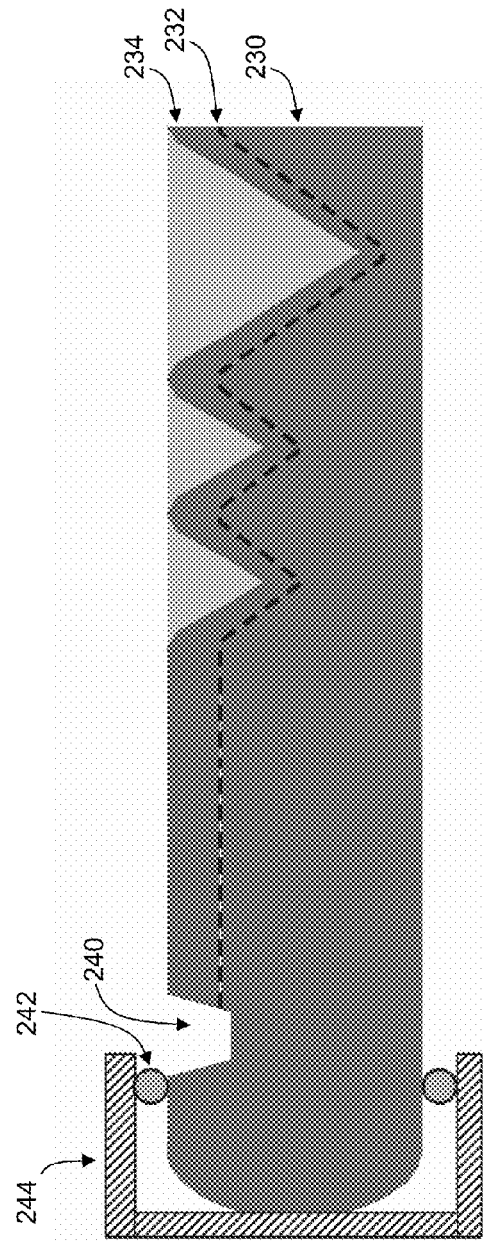
Figure 13:
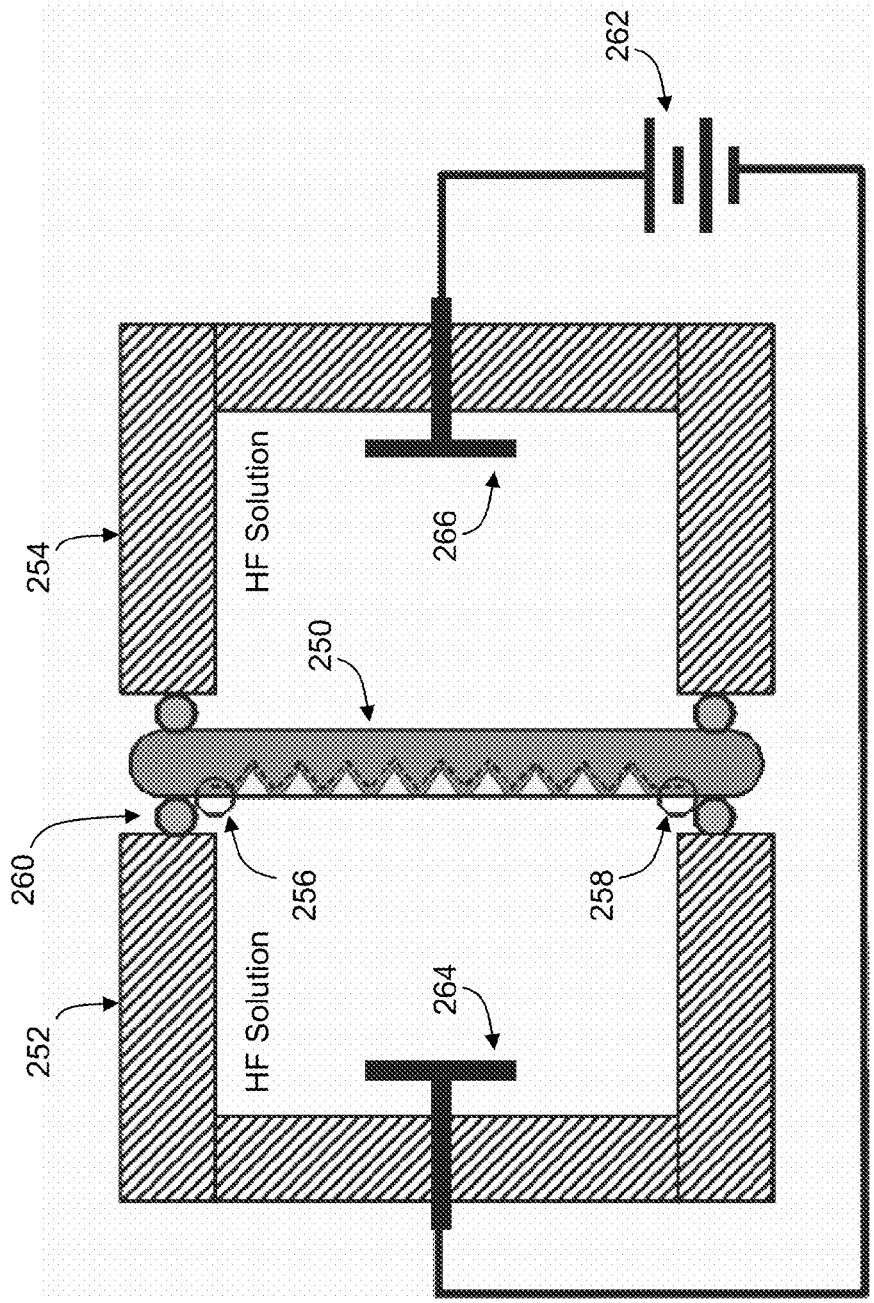

FIGS. 9A through 9F, 10A and 10B, 11A and 11B, and 12A and 12B are cross-sectional diagrams of a 3-D TFSS showing the formation of an inner trench and an outer trench; and FIG. 13 is a schematic of a dual-tank anodic etching cell used to perform the self aligned anodic silicon etching of an outer trench.

DETAILED DESCRIPTION OF THE SPECIFIC EMBODIMENTS

The following description is not to be taken in a limiting sense, but is made for the purpose of describing the general principles of the present disclosure. The scope of the present disclosure should be determined with reference to the claims. And although described with reference to the manufacture of a thin-film silicon substrate, a person skilled in the art could apply the principles discussed herein to any semiconductor material and the manufacture of a substantially planar or a 3-D thin-film semiconductor substrate. Exemplary embodiments of the present disclosure are illustrated in the drawings, like numbers being used to refer to like and corresponding parts of the various drawings.

Figure 1A:
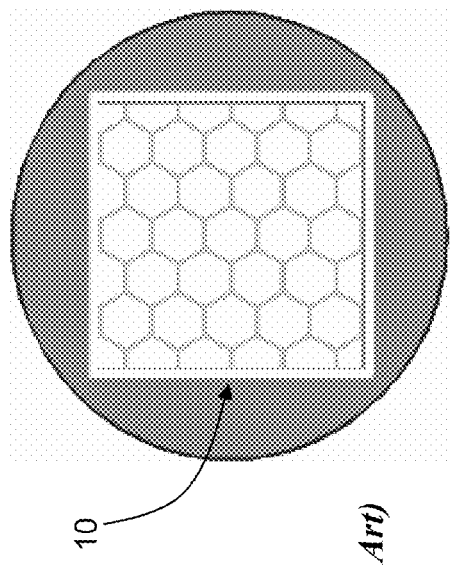
FIG. 1A (PRIOR ART) is a diagram of a top view of a 3-D TFSS prior to its release from a silicon template.
Figure 1B:
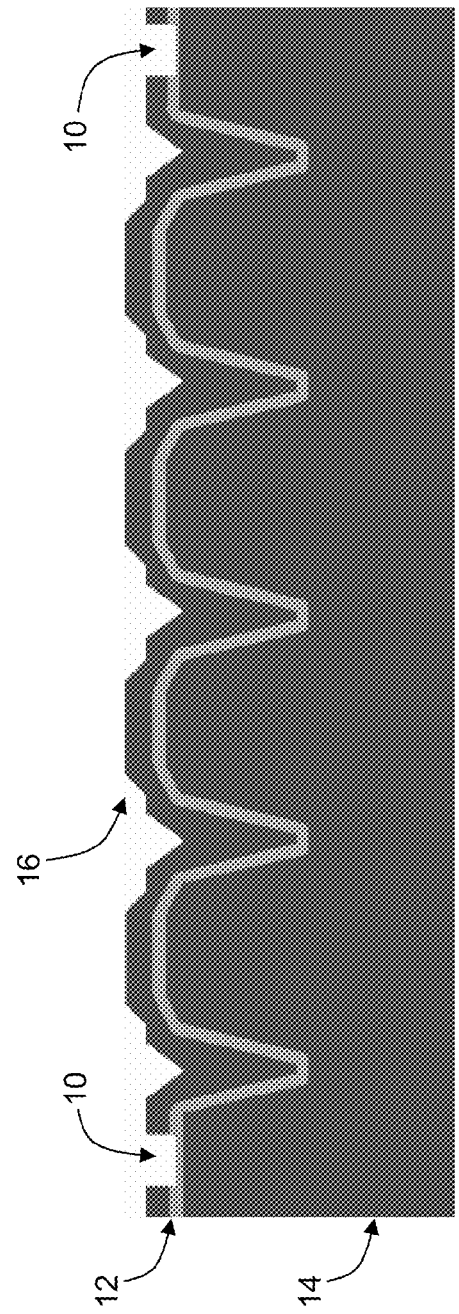
FIG. 1B (PRIOR ART) is a cross-sectional diagram of a 3-D TFSS prior to its release from a silicon template.

FIGS. 1A and 1B illustrate a self-supporting three-dimensional honey-comb prism thin-film silicon substrate (3-D TFSS) according to U.S. application Ser. No. 11/868,489 (U.S. Patent Pub. No. 2008/0264477A1).

Figure 2A:
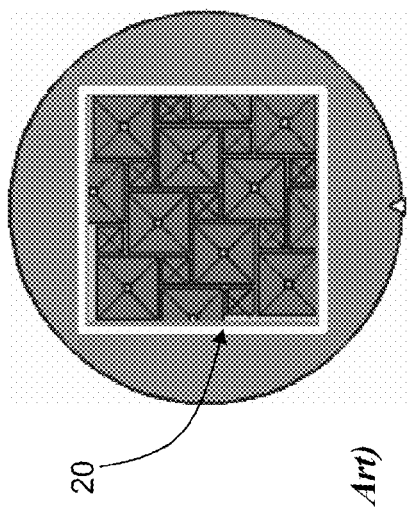
FIG. 2A (PRIOR ART) is a diagram of a top view of an inverted pyramidal 3-D TFSS prior to its release from a silicon template.
Figure 2B:
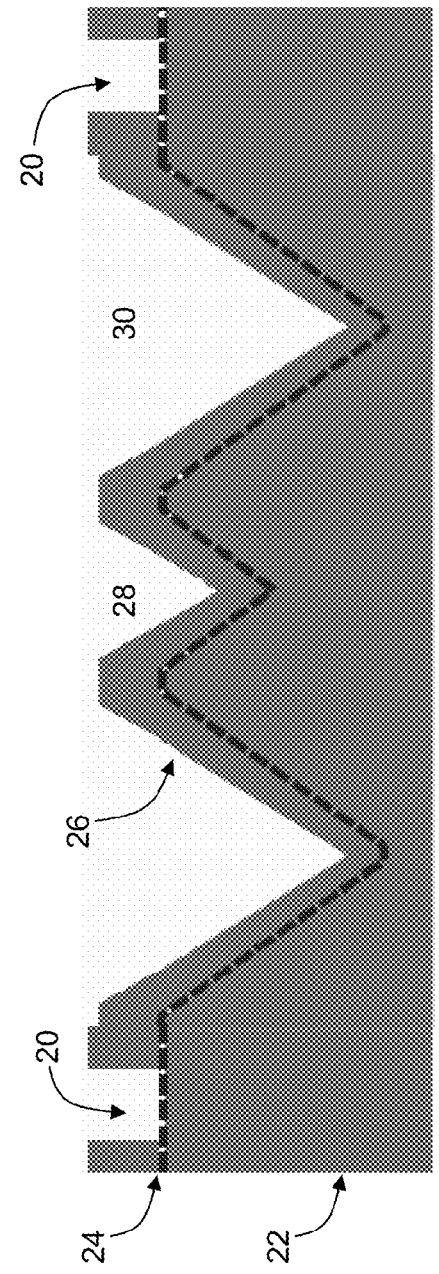
FIG. 2B (PRIOR ART) is a cross-sectional diagram of an inverted pyramidal 3-D TFSS prior to its release from a silicon template.

FIGS. 2A and 2B illustrate schematic drawings of an alternate 3-D TFSS design and method for making a 3D-TFSS.

Figure 3:
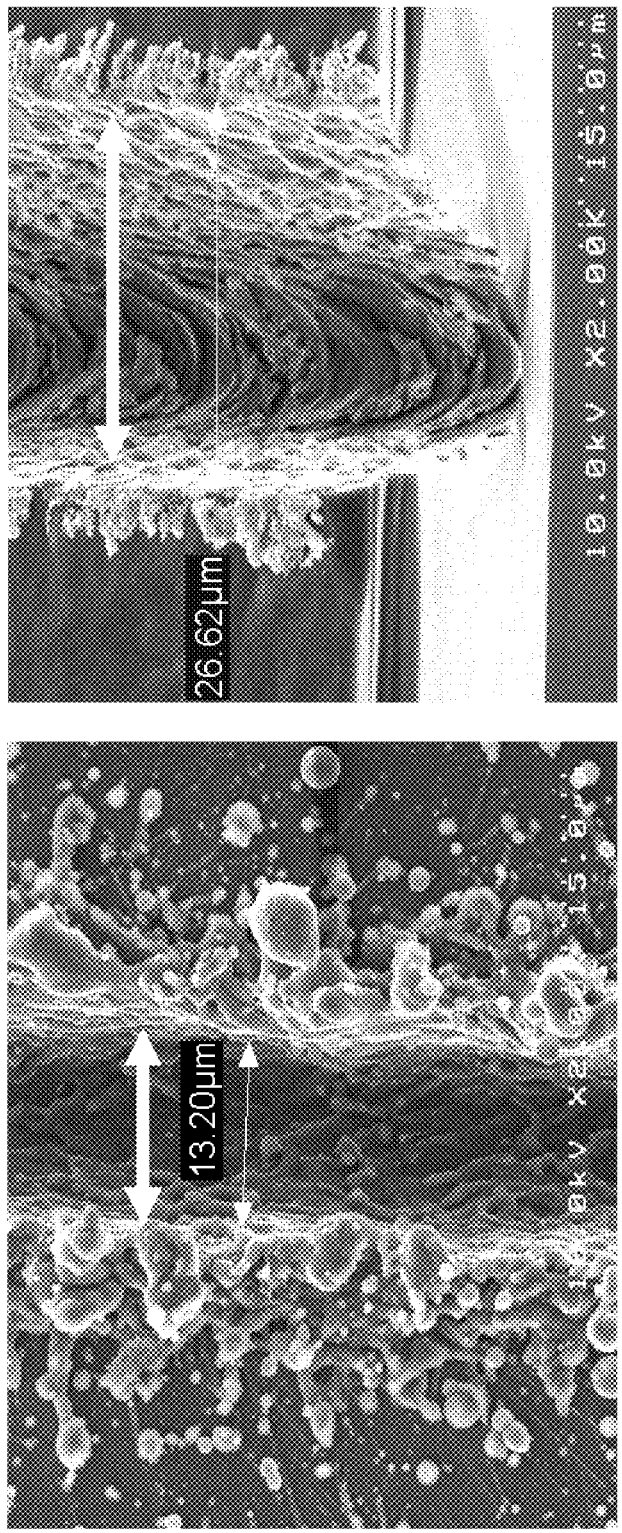
FIG. 3 is an SEM photo of a trench made by laser cutting.

FIG. 3 is a SEM photo of a shallow trench made by a known laser cutting process.

Figure 4:
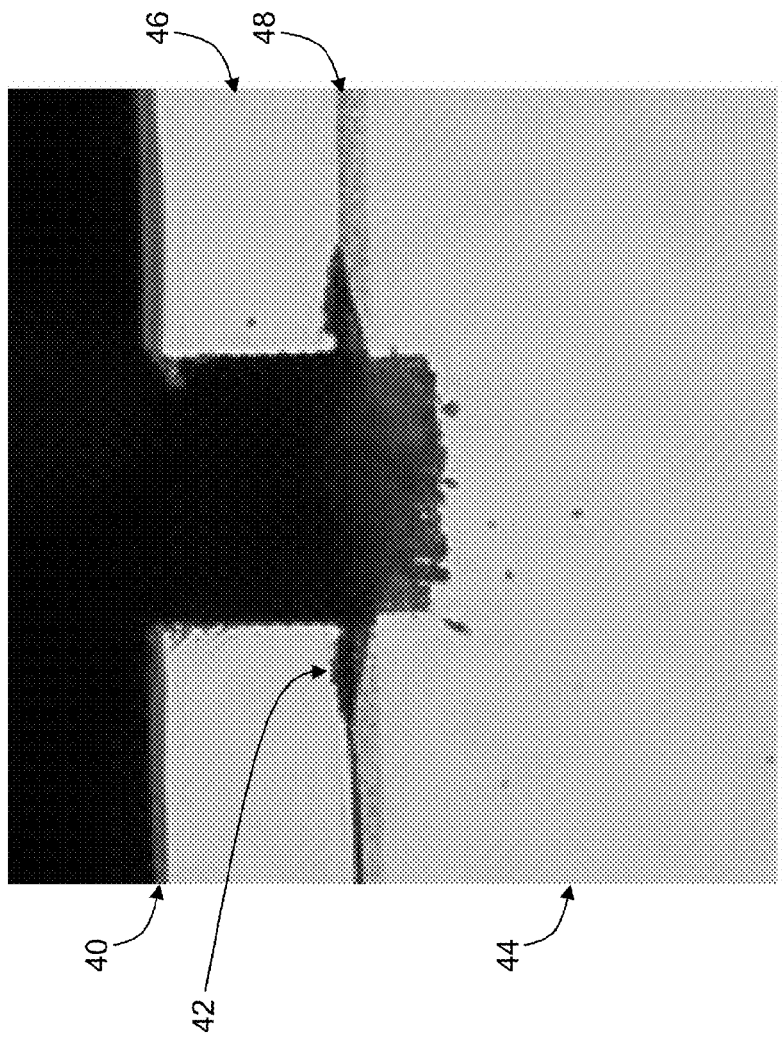
FIG. 4 is a cross-sectional photo showing a trench made by silicon DRIE etching.

FIG. 4 is a cross-sectional photo showing a shallow 50 um wide trench made using a known DRIE etching process.

Figure 5:
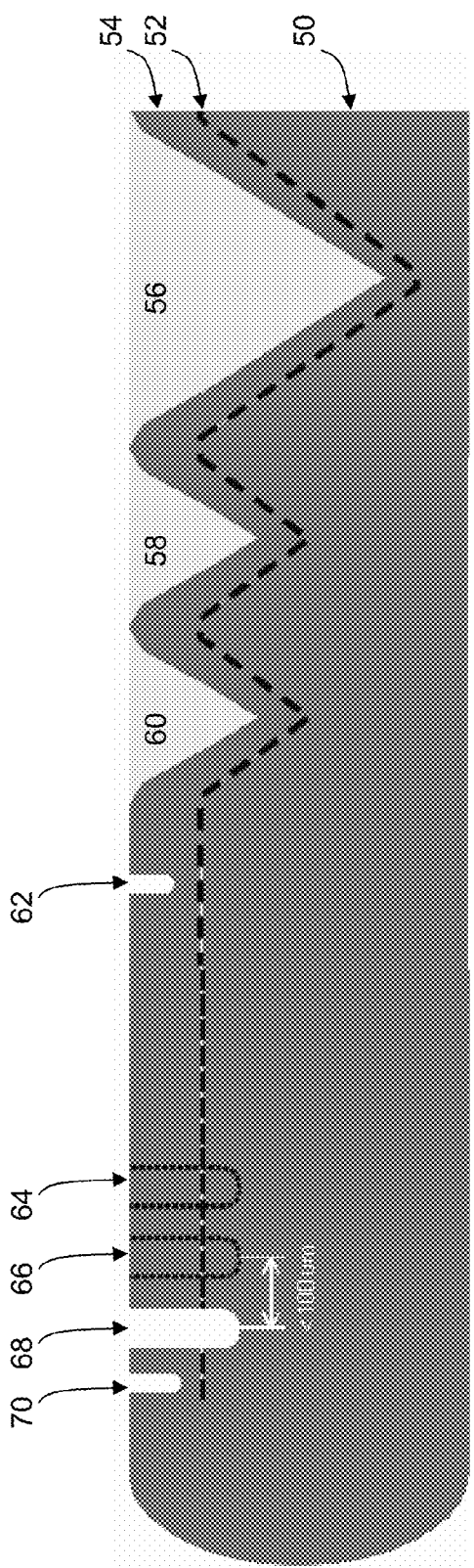
FIG. 5 is a cross-sectional diagram of a 3-D TFSS prior to its release from a silicon template.

FIG. 5 is a cross-sectional diagram of the edge/corner of a 3-D TFSS manufactured according to the process described in FIGS. 2A and 2B and utilizing the double trench method of the disclosed subject matter. Shown, 3-D TFSS 54 has yet to be released from silicon template 50—by either mechanically fracturing or etching away porous silicon 52. 3-D TFSS 54 has a staggered inverted pyramid cavity design with large pyramid cavity 56, small pyramid cavity 58, and substrate encompassing V-groove 60 each having been crystallographically etched into silicon template 50. The staggered inverted pyramid cavity design is then transferred into an epitaxial grown 3-D TFSS—which results in a 3-D TFSS having a shape conformal to that of the staggered inverted pyramid cavity design on silicon template 50. The staggered pattern provides enhanced mechanical rigidity to the 3-D TFSS.

To release 3-D TFSS 54 from silicon template 50, trenches must be created through 3-D TFSS 54 to expose porous silicon layer 52. FIG. 5 shows an embodiment of the double-trench method of the present application. Inner shallow trench 62 defines the outer boundary of the finished 3-D TFSS. Outer deep trench 68 is cut through porous silicon layer 52 and provides access to porous silicon layer 52 so that 3-D TFSS 54 may be released. Silicon template 50 is a reusable template and for each successive template re-use cycle the lateral location of the outer deep trench may be changed with a controlled indexing distance. In FIG. 5, outer deep trench 68 is used in a first 3-D TFSS manufacturing cycle and outer deep trench 66 and outer deep trench 64 will be used in successive cycles. Each outer deep trench is laterally located 100 um inside the previously used outer deep trench. Optional outer shallow trench 70 provides a marker showing the edge of buried porous silicon layer 52.

Figure 9A:
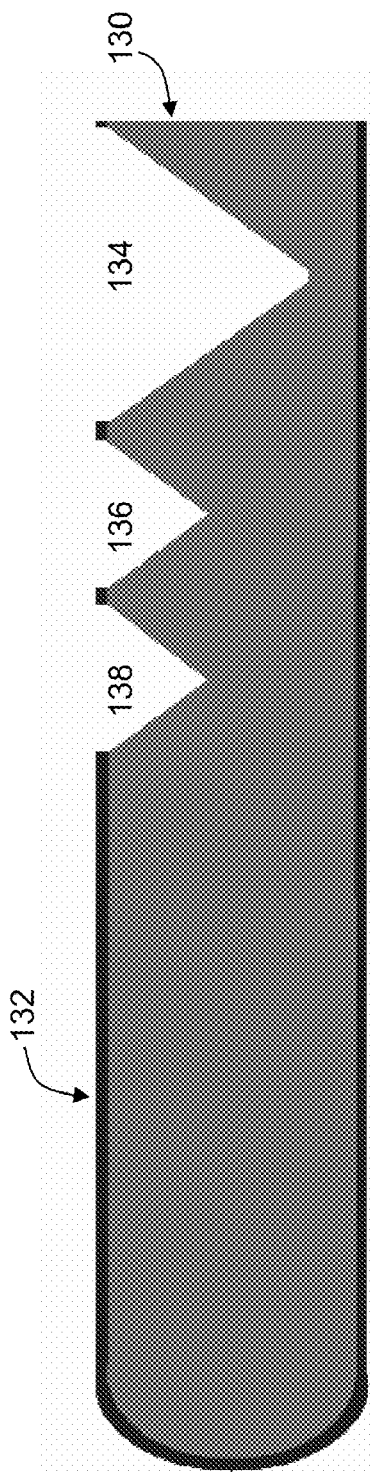
Figure 9B:
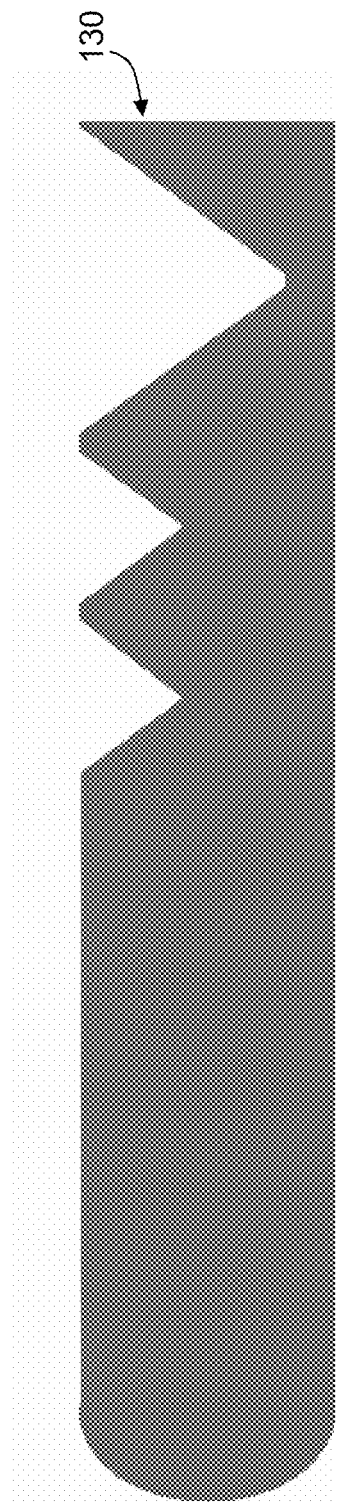

The inner shallow trenches of the present disclosure, such as inner shallow trench 62 in FIG. 5, are aligned to the crystallographic directions of the mono-crystalline silicon wafer, such as 3-D TFSS 54 in FIG. 5, to increase the ease of snapping off the excess peripheral silicon wafer during or after the 3-D TFSS release (see FIG. 9B).

As shown in FIG. 5, inner shallow trench 62 is made in close proximity to the actively solar cell area, an inverted pyramid cavity array in this case. Importantly, because the inner shallow trench depth only reaches into the 3-D TFSS, the location/distance of the inner shallow trench relative to the active solar cell area does not have to change for each template re-use because the template is not marked by the formation of the inner shallow trench. As a result, the final shape and size of the released 3-D TFSS is defined by the inner shallow trench. Laser cutting/scribing is one method for machining the inner shallow trench. Alternatively, mechanical diamond tip scribing may also be used.

The inner trenches are aligned to the crystallographic directions of the single-crystal silicon wafers to ease the snapping/breaking off the flat areas between the inner and outer trenches. The alignment to the crystallographic directions and the placement of the inner shallow trenches relative to the pyramid patterns is achieved by using alignment marks/fiducials or other identifiable features on the wafer.

As shown in FIG. 5, outer deep trench 68 is cut through the epitaxial silicon (3-D TFSS 54) and thin porous silicon layer 52 to expose the buried porous silicon layer and make lateral physical separation of the 3-D TFSS from the peripheral surface areas. As a result, the trench bottom is extended into the bulk of silicon template 50. The deep trench provides access to the porous silicon layer and thus facilitates the release of the 3-D TFSS from the silicon template. The release may be accomplished by the methods disclosed in U.S. application Ser. No. 12/473,811 (U.S> Patent Pub. No. 2010/0022074A1), entitled "SUBSTRATE RELEASE METHODS AND APPARATUS" or any other release method. In yet another alternative approach, the inner trench may be made after the TFSS release, in which case the trench may be cut through the flat silicon layer.

As with forming the inner shallow trenches, many commercially available laser cutting/scribing systems may be used for the outer deep trench making. Not only is a trench depth tolerance of +/−20 um achievable and practical for a 20 um to 100 um trench depth, the trench width may be maintained in a dimension of less than 50 um. In most X-Y stage controlled laser machining systems, the trench position lateral control could be achieved with a tolerance of +/−25 um. Therefore, it is practical to have the subsequent re-use outer trench located within 100 um next to the previous re-use outer trench. Thus every 1 mm of lateral surface area will be large enough to have ten outer trenches made in ten 3-D TFSS manufacturing cycles. In other words, a 5 mm wide flat surface area in the 3-D TFSS periphery (defined as the area between the template edge and the inner shallow trench) will be enough to make outer trenches for more than 50 template re-use cycles.

Figure 6:
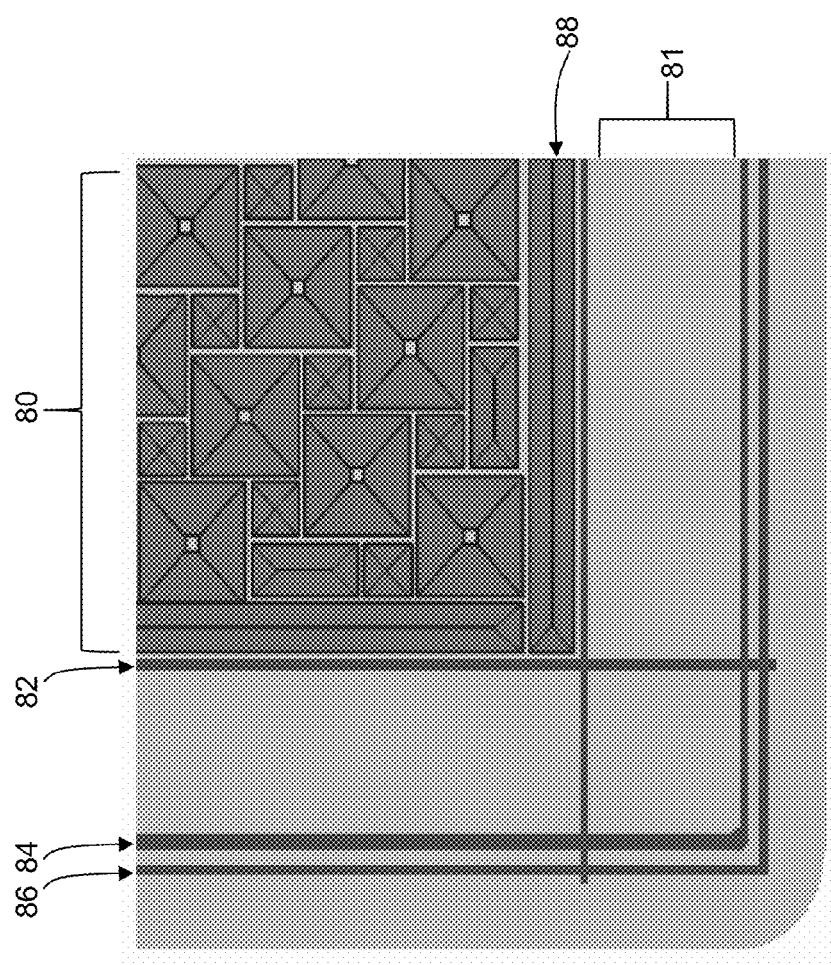
FIG. 6 is a diagram of a top view of a 3-D TFSS prior to its release from a silicon template.

FIG. 6 is a diagram of a top view of a 3-D TFSS prior to its release from a silicon template. Finished 3-D TFSS has a staggered inverted pyramid cavity design with large pyramid cavities, small pyramid cavities, and substrate encompassing V-groove 88. Inner shallow trench 82 defines the size and shape of the 3-D TFSS and outer deep trench 84 provides access to the buried porous silicon layer beneath so that 3-D TFSS 80 may be released. V-grooves 88 aligned along the outside of the 3-D TFSS provide mechanical strength. 3-D TFSS periphery (the area on the layer of flat epitaxial silicon between inner shallow trench 82 and outer deep trench 84) will be removed after the 3-D TFSS has been released from the template. Optional outer shallow trench 86 provides a marker showing the edge of the buried porous silicon layer.

Figure 7:
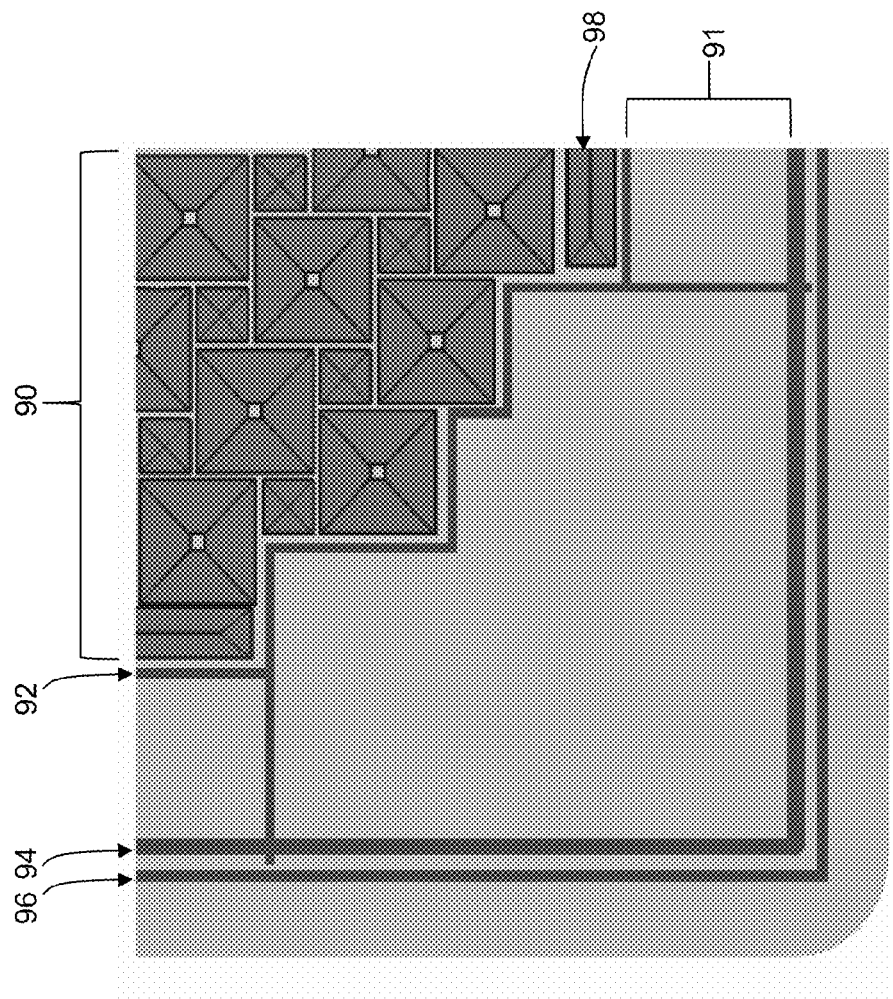
FIG. 7 is a diagram of a top view of a 3-D TFSS with an alternative pyramid cavity design prior to its release from a silicon template.

FIG. 7 is a diagram of a top view of a 3-D TFSS with an alternative pyramid cavity design prior to its release. Finished 3-D TFSS 90 has rounded corners so it is necessary that inner shallow trench 92 be created in a zigzag pattern of small steps to define the boundary of 3-D TFSS 90. And each inner trench segment is aligned to a crystallographic direction. Outer deep trench 94 provides access to the buried porous silicon layer beneath so that 3-D TFSS 90 may be released. V-grooves 98 aligned along the outside of the 3-D TFSS provide mechanical strength. 3-D TFSS periphery 91 (the area on the layer of epitaxial silicon between inner shallow trench 92 and outer deep trench 94) will be removed after the 3-D TFSS has been released from the template. Optional outer shallow trench 96 provides a marker showing the edge of the buried porous silicon layer.

Figures 8A, 8B:
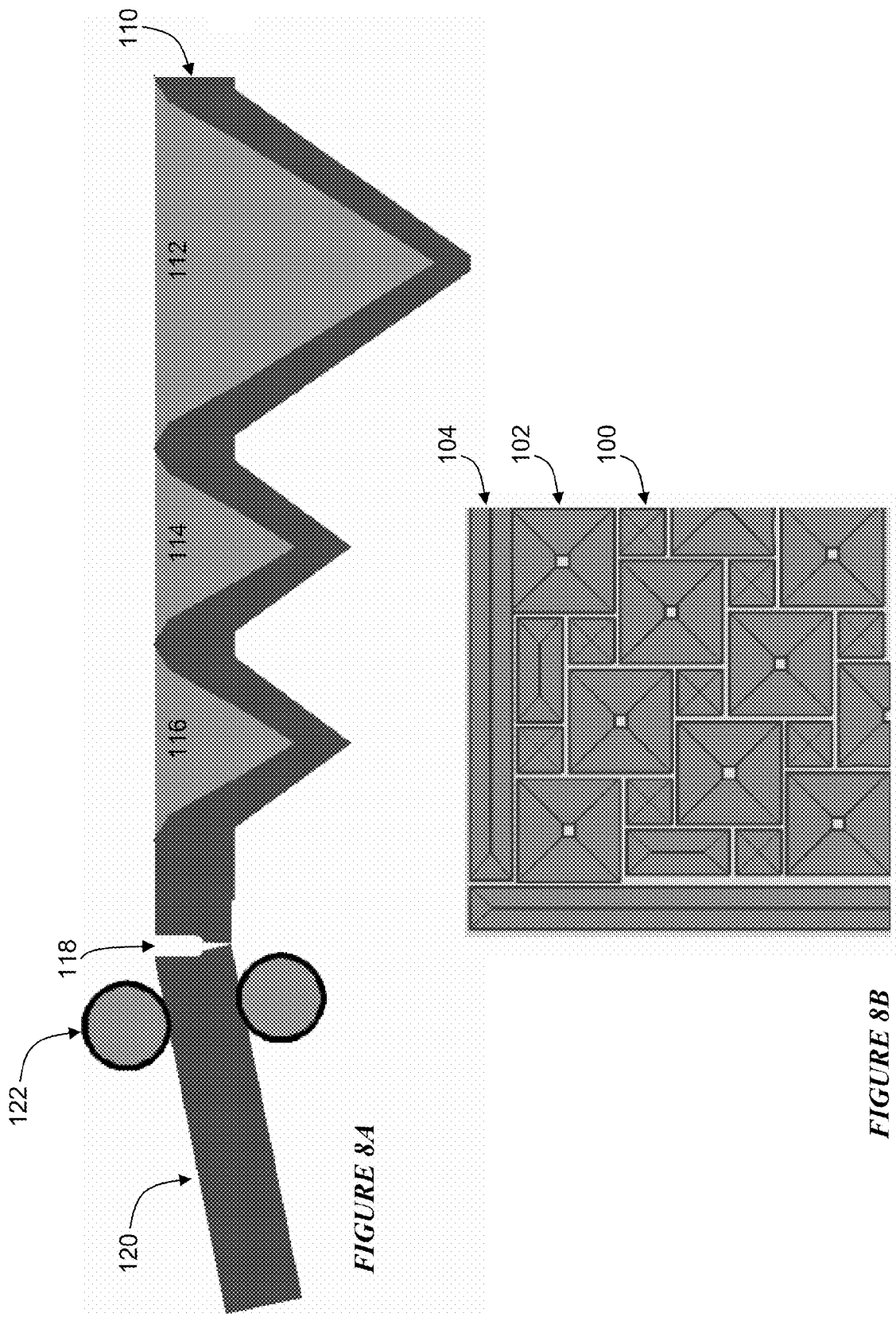
FIG. 8A is a cross-sectional view of a released 3-D TFSS showing a mechanical snapping method for removing flat silicon areas.
FIG. 8B is a top view of a released 3-D TFSS after the removal of flat silicon areas.

During or after the 3-D TFSS release, the flat silicon areas between the inner and outer trenches may be snapped or broken off from the 3-D TFSS by using the inner shallow trench as a cleaving and separation guild line. FIG. 8A is a cross-sectional view of a released 3-D TFSS showing a mechanical snapping method for removing flat silicon areas. Released 3-D TFSS 110 has a staggered inverted pyramid cavity design—shown with large pyramid cavity 112, small pyramid cavity 114, and substrate encompassing V-groove 116. Note the V-groove patterns outside the pyramid cavity area. The V-grooves enhance the mechanical integrity of the 3-D TFSS. Inner shallow trench 118 acts as a cleaving line to separate flat silicon area 120 from 3-D TFSS 110. Flat silicon area 120 is the portion of the 3-D TFSS between the inner trench and outer trench. Snapping arm 122 exerts force on 3-D TFSS 110 to break off flat silicon area 120 at structurally weakened inner shallow trench 118.

Because the mechanical integrity of the flat silicon area is much weaker than the pyramid area, the flat area may be easily broken off during the 3-D TFSS releasing process. Other methods for breaking off the flat silicon area from the shallow trench include using an air jet and ultrasonic cleaning.

FIG. 8B is a top view of a released 3-D TFSS after the removal of flat silicon area 120. Note V-groove 104 patterns run outside of the pyramid cavity and encompass the area patterned by various rectangular pyramidal shapes such as large pyramid cavity 102 and small pyramid cavity 100.

FIGS. 9A through 9F, 10A and 10B, 11A and 11B, and 12A and 12B are cross-sectional diagrams showing the formation of a 3-D TFSS according to the disclosed subject matter. The disclosed trench formation methods may be used in any combination to make the inner trenches, outer trenches, or both inner and outer trenches.

FIGS. 9A through 9B illustrate the major fabrication process steps of making a silicon template having inverted pyramidal cavities. FIGS. 9C through 9F illustrate multi-cycle double-trench formation on a re-usable template.

The fabrication process starts with single-crystal (100) silicon wafer with a hard mask layer, such as thermally grown silicon dioxide. A photoresist pattern is generated on top of the oxide mask layer according to a photolithography step (comprising of photoresist coating, baking, UV light exposure over a photomask, post baking, photoresist developing, wafer cleaning and drying). The pattern is aligned to the (100) direction and depicts an array or a staggered pattern of inverted pyramidal base openings. The photoresist pattern is then transferred into the oxide layer by etching the exposed oxide with buffered HF solution. After that the remaining photoresist layer is removed by plasma ashing or wet chemical cleaning. The patterned silicon dioxide layer is used as a hard mask layer during anisotropic silicon etching. The mask layer includes but not limited to substances such as silicon dioxide. The oxide on the wafer backside and wafer edges is not removed in order to protecting the silicon surfaces that are not to be etched during the subsequent anisotropic silicon etch.

The wafer is then batch loaded in an anisotropic silicon wet etchant such as KOH solution. The typical etch temperature is in the range of 50° C. to 80° C. and etch rate is about 0.2 um/min to 1 um/min. TMAH (tetramethylammonium hydroxide) is an alternative anisotropic silicon etching chemical. The KOH or TMAH silicon etch rate depends upon the orientations to crystalline silicon planes. The (111) family of crystallographic planes are etched at a very slow rate and are normally "stop" planes for the anisotropic etching of a (100) silicon wafer with patterned hard mask. As a result, the intersection of two (111) planes or a (111) plane with a bottom (100) plane produce anisotropic etching structures for (100) silicon wafers after a time-controlled etch. Examples of these structures include V-grooves and pyramidal cavities with sharp tip cavity bottom (where (111) planes meet) or a small flat cavity bottom (a remaining (100) plane).

FIG. 9A illustrates silicon wafer template 130 after controlled KOH etching. Patterned silicon dioxide layer 132 protects wafer areas that are not to be etched and exposes areas to be etched, such as large pyramid cavity 134, small pyramid cavity 136, and encompassing V-groove 138. Each inverted cavity has side walls aligned along the (111) crystallographic plane.

FIG. 9B illustrates a cross-sectional view of wafer template 130 after the remaining silicon dioxide layers are removed in HF solution.

Figure 9C:
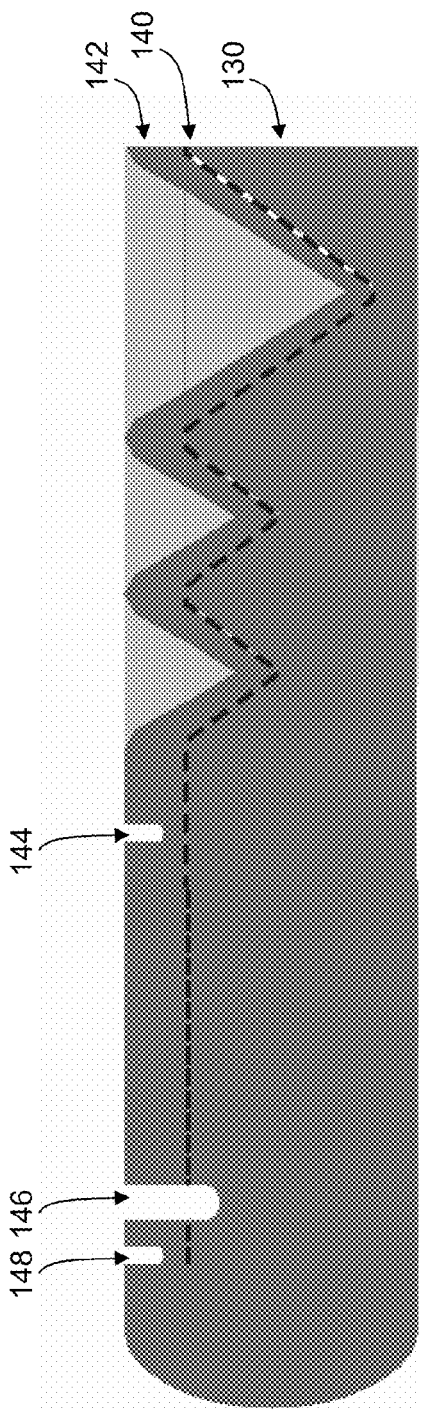

FIG. 9C shows porous silicon layer 140 formed on the top surfaces of silicon wafer template 130. Porous silicon layer 140 is used as a sacrificial layer for the release of epitaxial silicon layer 142 (the release of which forms a 3-D TFSS). Porous silicon layer 140 may consist of two thin layers. The first thin porous silicon layer is on top and is first formed from the bulk silicon of silicon wafer template 130. The first thin layer has a low porosity of 15% -30%. The second thin porous silicon layer is directly grown from the bulk silicon of wafer template 130 and is underneath the first thin layer of porous silicon. The $2^{nd}$ thin porous silicon layer has a high porosity in the range of 60%~85%. The top low porosity layer is used as a seed layer for high quality epitaxial silicon growth (for the formation of epitaxial silicon layer 142) and the underneath high porosity silicon layer is used for easier release of epitaxial silicon layer 142. Before the epitaxial silicon growth, the wafer is baked in a high temperature hydrogen environment within the epitaxial silicon deposition reactor. As shown in FIG. 9C, border definition trenches including inner shallow trench 144, outer deep trench 146, and optional outer shallow trench 148 are made by laser cutting/scribing process with the laser beam aligned to pre-structured patterns, such as fiducials, on the template/wafer. Alternatively, the trench location may be aligned indirectly to the template/wafer by aligning the trenches to alignment features outside the template/wafer. The trenches may also be aligned to the wafer crystallographic directions, such as <100> directions. Optional outer shallow trench 148 provides a marker showing the edge of buried porous silicon layer 140.

Figure 9D:
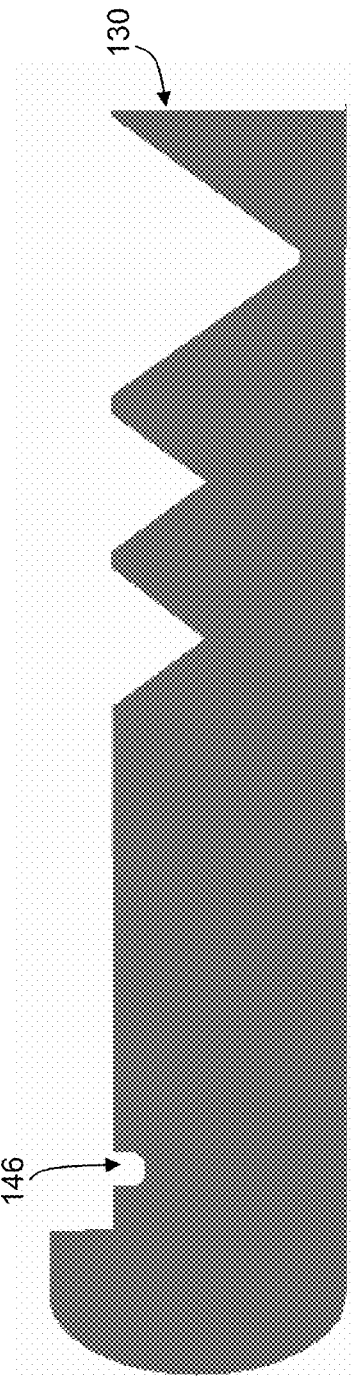

FIG. 9D illustrates silicon wafer template 130 after the release of a first epitaxial silicon layer, shown in FIG. 9C as epitaxial silicon layer 142 (which forms the 3-D TFSS). The release could be done by mechanical separation and/or chemical porous silicon sacrificial layer etching. As disclosed in U.S. application Ser. No. 11/868,489 (U.S. Patent Pub. No. 2008/0264477A1), "METHODS FOR MANUFACTURING THREE-DIMENSIONAL THIN-FILM SOLAR CELLS" the released TFSS may then be processed into a solar cell while the silicon wafer template will be used again. It is to be noted that only the outer deep trench 146 left a mark on silicon wafer template 130. The shallow trench patterns, such as those of inner shallow trench 144 in FIG. 9C, do not cut into the silicon wafer template and are fully removed with the released 3-D TFSS.

Figure 9E:
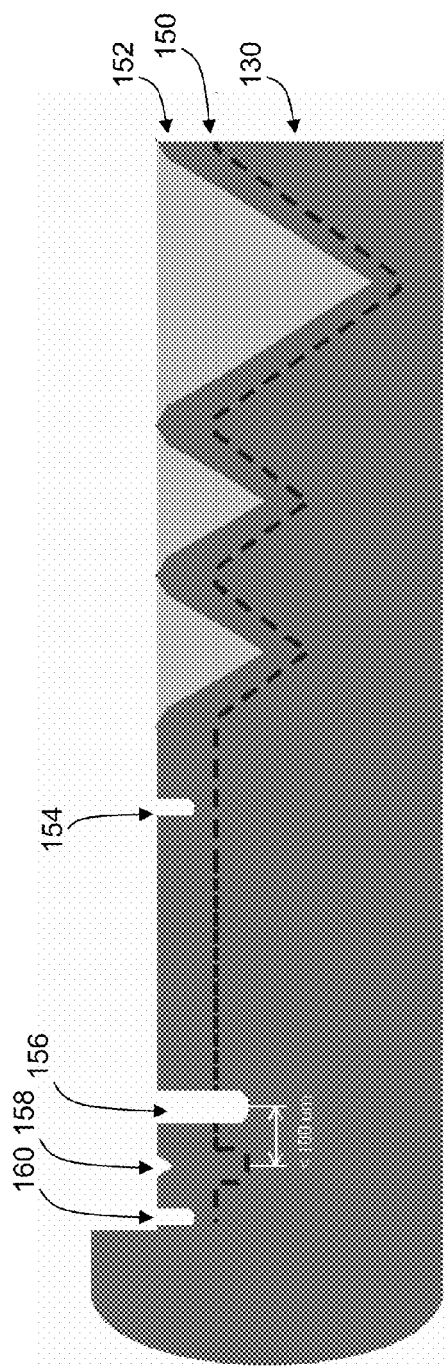

FIG. 9E illustrates a second use of silicon wafer template 130. The major processing steps are the same as those described in FIG. 9C, including the formation porous silicon layer 150, epitaxial silicon growth which forms epitaxial silicon layer 152, and aligned border trench definition. Inner shallow trench 154 is made in the same location relative to the patterns on the template as inner shallow trench 144 in FIG. 9C, while outer deep trench 156 is made a small distance (such as less than 100 um) away from the location of the previous outer deep trench. Indention 158 identifies where the location of the previous outer deep trench—here outer deep trench 146 in FIG. 9C. As a result, the same laser trench making methods may be used to form the outer deep trenches of all the re-use cycles for silicon wafer template 130.

Optional outer shallow trench 160 provides a marker showing the edge of buried porous silicon layer 150.

Figure 9F:
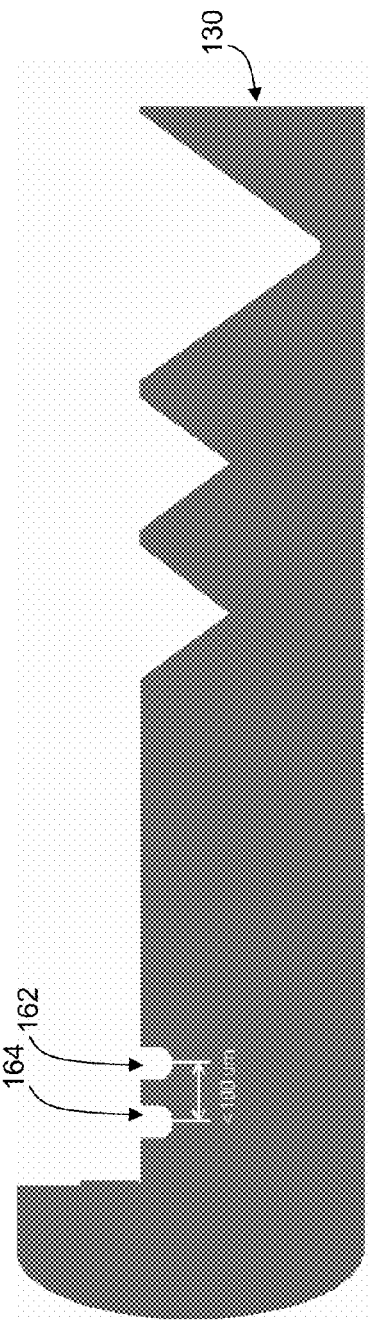

FIG. 9F illustrates silicon wafer template 130 after the release of a second epitaxial silicon layer, shown in FIG. 9E as epitaxial silicon layer 152 (which forms the 3-D TFSS). Again, note that only the outer deep trenches left patterns on silicon wafer template 130—pattern 164 left by outer deep trench 146 in FIG. 9C first 3-D TFSS manufacture cycle, and pattern 162 left by outer deep trench 156 in FIG. 9E in the second 3-D TFSS manufacture cycle.

The location of the outer deep trench for subsequent template reuse cycles are aligned offset against the previous reuse cycle to ensure that the outer deep trenches cut into the template from previous/different template reuse cycles do not overlap. However, the inner trench location of every reuse cycle may be the same and not offset from previous inner trenches in previous/different template reuse cycles. Therefore, the 3-D TFSS released from different template reuse cycles have same size and shape. Thus, the disclosed border trench making method may be used for releasing the 3-D TFSS in multiple template re-use cycles.

Figure 10A:
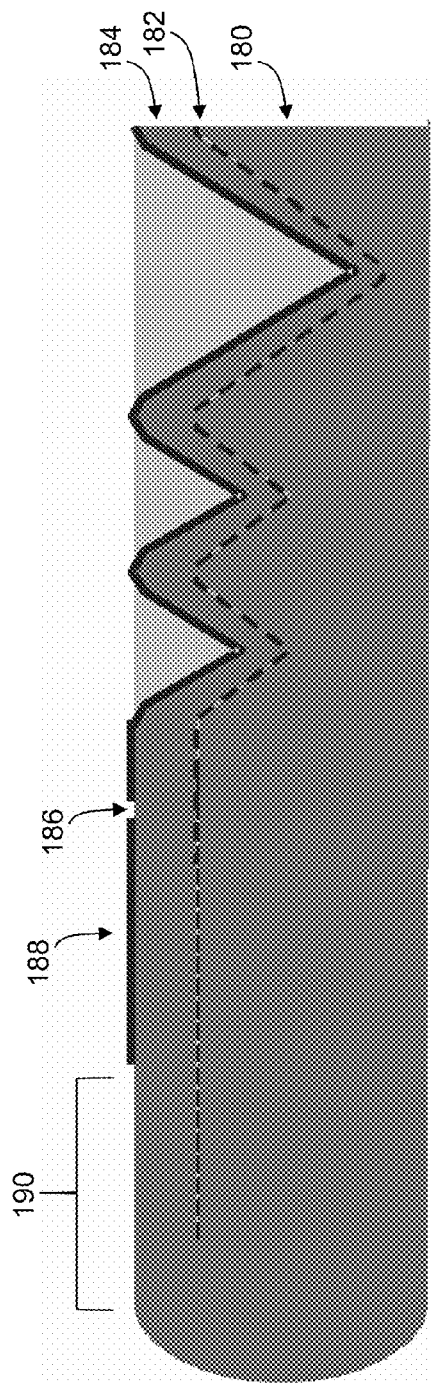
Figure 10B:
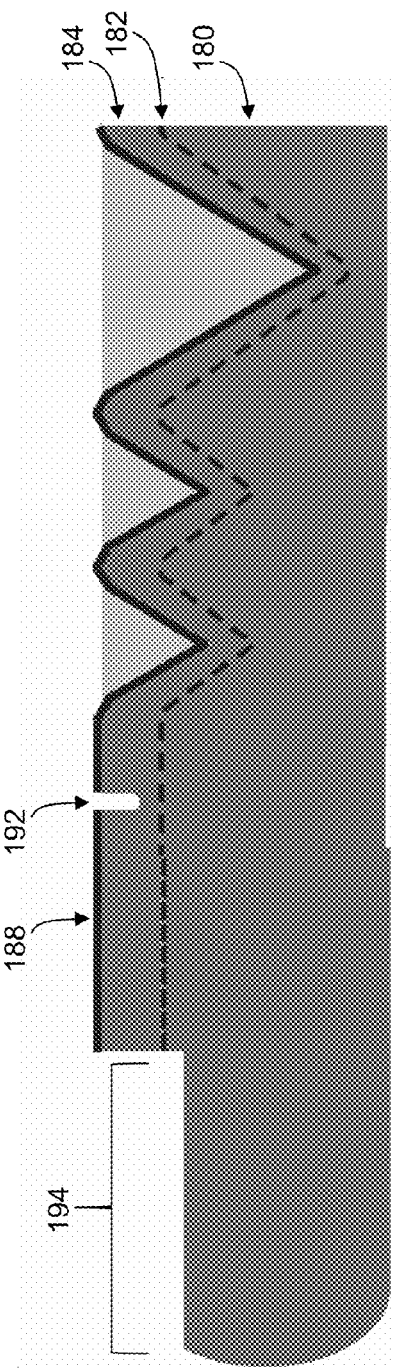

Alternatively silicon DRIE etching may be used to form the inner and outer trenches. FIGS. 10A and 10B illustrate the formation of border trenches on a silicon template using silicon DRIE etching. FIG. 10A illustrates silicon wafer template 180, porous silicon layer 182, and epitaxial silicon layer 184. Silicon wafer template 180 has a staggered inverted pyramid cavity design with large pyramid cavities, small pyramid cavities, and substrate encompassing V-groove and thus produces a 3-D TFSS having a conformal design. Patterned hard etching mask 188 is used to cover the surface areas of epitaxial silicon layer 184 that should not be etched. Narrow opening 186 on patterned hard etching mask 188 defines the opening of the inner shallow trench. Wide opening 190 patterned hard etching mask 188 defines the opening of the outer deep trench. Examples of the etching mask include a patterned photoresist or oxide layer.

FIG. 10B illustrates the trenches formed on silicon wafer template 180 according to the silicon DRIE process. Inner shallow trench 192 is formed according to the silicon DRIE process and the trench depth is less than the thickness of epitaxial layer 184. Outer deep trench 194 is also formed according to the silicon DRIE process and provides access to porous silicon layer 182. Further, epitaxial silicon layer 184 at wafer edge is fully removed. The etch rate differential between a narrow (sum or less) exposed silicon area, such as narrow opening 186, and a large exposed silicon area, such as wide opening 190, is caused by the etch lag due to the reactive gas diffusion limitations. After trench formation, the 3-D TFSS (epitaxial silicon layer 184) may be released from silicon wafer template 180 and the template then may be re-used again.

In yet another alternative embodiment, anisotropic silicon wet etching, such as KOH etching, may be used to form the inner and outer trenches. FIGS. 11A and 11B illustrate the formation of border trenches on a silicon template using silicon wet etching with a KOH solution.

FIG. 11A illustrates silicon wafer template 200, porous silicon layer 202, and epitaxial silicon layer 204. Silicon wafer template 200 has a staggered inverted pyramid cavity design with large pyramid cavities, small pyramid cavities, and substrate encompassing V-groove and thus produces a 3-D TFSS having a conformal design. Patterned hard etching mask 208 is used to cover the surface areas of epitaxial silicon layer 204 that should not be etched. Narrow opening 206 on patterned hard etching mask 208 defines the opening of the inner shallow trench. Wide opening 210 patterned hard etching mask 208 defines the opening of the outer deep trench. Examples of the etching mask include a patterned photoresist or oxide layer.

FIG. 11B illustrates the trenches formed on silicon wafer template 200 according to the silicon wet etching with KOH solution process. Inner shallow trench 212 is formed according to the silicon wet etching process and the trench depth is less than the thickness of epitaxial layer 204. Outer deep trench 214 is also formed according to the silicon wet etching process and provides access to porous silicon layer 202. Further, epitaxial silicon layer 204 at wafer edge is fully removed. Inner shallow trench 212 self-terminates when the (111) crystallographic planes forming the sidewalls of the trench meet—which forms the bottom of the trench. Narrow mask opening 206 is designed (at a particular width dependent on the thickness of epitaxial silicon layer 204) so that when the (111) planes meet to form the trench bottom, porous silicon layer 202 is not reached.

The KOH etching at wafer edge to create outer deep trench 214 is time-controlled. When the etching reaches porous silicon layer 202, a large amount of gas is released from the etching since the porous silicon is etched much faster than single-crystal silicon. When this happens, the KOH etching process is completed. After trench formation, the 3-D TFSS (epitaxial silicon layer 204) may be released from silicon wafer template 200 and the template then may be re-used again.

In an alternative embodiment, the removal of epitaxial silicon layer 204, as illustrated in FIG. 11B, may be performed by direct mechanical edge lapping, grinding or polishing. In this embodiment, inner shallow trench 212 may be formed by direct laser beam scribing/cutting. Therefore in this direct trench forming embodiment, the deposition and patterning of patterned hard etching mask 208 (to form narrow opening 206 and wide opening 210), as illustrated in FIG. 11A, are not needed.

In yet another alternative embodiment self-aligned and selective anodic silicon etching may be used to form the outer deeper trench which exposes the porous silicon layer necessary for 3-D TFSS release. FIGS. 12A and 12B illustrate the formation of border trenches on a silicon template using anodic silicon etching with HF solutions. This method takes advantage of the buried porous silicon layer and the wafer edge exclusion area of the porous silicon coverage. In other words, the buried porous silicon layer is used as a buried shadow mask to prevent anodic etching of the epitaxial silicon layer positioned on top of the porous silicon layer. This method is similar to the porous silicon formation method by the electrochemical anodisation of silicon in a hydrofluoric acid (HF) based electrolyte.

FIG. 12A illustrates silicon wafer template 230, porous silicon layer 232, and epitaxial silicon layer 234. Silicon wafer template 230 has a staggered inverted pyramid cavity design with large pyramid cavities, small pyramid cavities, and substrate encompassing V-groove and thus produces a 3-D TFSS having a conformal design.

FIG. 12B illustrated the self aligned anodic silicon etching of an outer deep trench occurs when the wafer of FIG. 12A is loaded into anodic etching setup 244. Due to the existence of buried porous silicon layer 232, because electrical current does not easily flow through the porous silicon layer (especially when a high porosity porous silicon layer exists) there is almost no etching of wafer interior area 238. However, there is no buried porous silicon layer in wafer edge area 236 where current can be conducted from the wafer backside to the front side. Thus, anodic etching of silicon selectively happens only in exposed wafer edge area 236—resulting in outer deep trench 240. And because wafer edge area 236 is in close proximity to sealing O-ring 242, outer deep trench 240 is formed in the area next to sealing O-ring 242. This phenomenon is also a result of current crowding. When a given voltage or current source is applied to the entire wafer, lower impedance silicon area has higher anodic etching rate. In this case, there is almost no etching of the epitaxial silicon layer that sits on top of the buried porous silicon layer (shown as wafer interior are 238 in FIG. 12A). Therefore, buried porous silicon layer 232 serves as a buried shadow mask for forming outer deep trench 240. The etching is time-controlled and it is effective in making outer deep trench 240 that has a circular shape and is located next to the O-ring.

FIG. 13 is a schematic of a dual-tank anodic etching cell used to perform the self aligned anodic silicon etching shown in FIGS. 12A and 12B. Left tank 252 and right tank 254 are separated by the silicon wafer to be etched, shown as silicon wafer 250 and are both filled with HF solution. Silicon wafer 250 is inserted between left tank 252 and right tank 254 with both silicon wafer 250 sides exposed to HF solution. Ethanol is added to the HF solution in order to improve the wettability of the acid. The cell is sealed by O-ring seals 260 placed on both edge sides of silicon wafer 250. Electrodes, shown as left electrode 264 and right electrode 266, connected to power supply 262 are connected to HF solutions in the tanks. As current flows between left tank 252 and right tank 254, selected areas of silicon wafer 250 that do not have a buried porous silicon layer blocking electric current are etched away. Shown, selective silicon etching areas 256 and 258, both proximate O-rings, are etched away leaving outer deep trenches on silicon wafer 250.

Alternatively, the wafer may be loaded into the anodic etch chamber with an electrically insulating shadow mask covering the main cell area but leaving the peripheral regions on the template open for formation of porous silicon until such peripheral porous silicon fully consumes the epitaxial layer in the periphery region and reaches the buried porous silicon layer under the 3D substrate to be released. The porous silicon formation can be terminated by monitoring the anodic etch current and/or voltage to detect an endpointing signal when the entire epitaxial layer is converted to porous silicon in the peripheral region of the template. The template wafer can then be removed from the anodic etch chamber to proceed with separation of the substrate from the template using mechanical and/or chemical etch release methods.

In operation, the disclosed subject matter provides a method for forming inner and outer border definition trenches to aide in releasing a thin-film semiconductor substrate from a reusable template. A porous semiconductor layer is conformally formed on a reusable template. A thin-film semiconductor substrate is then formed on and conformal to the porous semiconductor layer. An outer deep trench is formed on the thin-film semiconductor substrate which provides access to the porous semiconductor layer formed between the template and the thin-film semiconductor substrate. An inner trench is also formed on the thin-film semiconductor substrate (before or after the release of the thin-film semiconductor substrate from the reusable template) which helps define the released thin-film semiconductor substrate for further processing. The thin-film semiconductor substrate is then released from the reusable template.

The foregoing description of the preferred embodiments is provided to enable any person skilled in the art to make or use the claimed subject matter. Various modifications to these embodiments will be readily apparent to those skilled in the art, and the generic principles defined herein may be applied to other embodiments without the use of the innovative faculty. Thus, the claimed subject matter is not intended to be limited to the embodiments shown herein but is to be accorded the widest scope consistent with the principles and novel features disclosed herein.

What is claimed is:

1. A method for fabrication of a thin-film semiconductor substrate, the method comprising:
   forming a porous semiconductor layer on a reusable semiconductor template, said porous semiconductor layer conformal to said reusable semiconductor template;
   forming a thin-film semiconductor substrate on said porous semiconductor layer, said thin-film semiconductor substrate conformal to said porous semiconductor layer;
   forming an inner trench according to a mechanical scribing process on said thin-film semiconductor substrate, said inner trench having a depth less than a thickness of said thin-film semiconductor substrate;
   forming an outer trench on said thin-film semiconductor substrate providing access to said porous semiconductor layer and positioned between said inner trench and an edge of said thin-film semiconductor substrate; and
   releasing said thin-film semiconductor substrate from said reusable semiconductor template.

2. A method for fabrication of a thin-film semiconductor substrate, the method comprising:
   forming a porous semiconductor layer on a reusable semiconductor template, said porous semiconductor layer conformal to said reusable semiconductor template;
   forming a thin-film semiconductor substrate on said porous semiconductor layer, said thin-film semiconductor substrate conformal to said porous semiconductor layer;
   forming an inner trench on said thin-film semiconductor substrate having a depth less than a thickness of said thin-film semiconductor substrate;
   forming an outer trench according to a mechanical scribing process on said thin-film semiconductor substrate, said outer trench providing access to said porous semiconductor layer and positioned between said inner trench and an edge of said thin-film semiconductor substrate; and
   releasing said thin-film semiconductor substrate from said reusable semiconductor template.

3. A method for fabrication of a thin-film semiconductor substrate, the method comprising:
   forming a porous semiconductor layer on a reusable semiconductor template, said porous semiconductor layer conformal to said reusable semiconductor template;
   forming a thin-film semiconductor substrate on said porous semiconductor layer, said thin-film semiconductor substrate conformal to said porous semiconductor layer;
   forming an inner trench according to a mechanical scribing process on said thin-film semiconductor substrate, said inner trench having a depth less than a thickness of said thin-film semiconductor substrate;
   forming an outer trench according to a mechanical scribing process on said thin-film semiconductor substrate, said outer trench providing access to said porous semiconductor layer and positioned between said inner trench and an edge of said thin-film semiconductor substrate; and
   releasing said thin-film semiconductor substrate from said reusable semiconductor template.

* * * * *